(12) United States Patent
Niiyama et al.

(10) Patent No.: US 8,748,505 B2
(45) Date of Patent: Jun. 10, 2014

(54) CURABLE RESIN COMPOSITION FOR FORMING SEAL PART, LAMINATE AND PROCESS FOR ITS PRODUCTION

(71) Applicant: Asahi Glass Company, Limited, Tokyo (JP)

(72) Inventors: Satoshi Niiyama, Tokyo (JP); Hiroshige Ito, Tokyo (JP); Naoko Aoki, Tokyo (JP); Yoshinobu Kadowaki, Tokyo (JP); Yukio Tsuge, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/949,424

(22) Filed: Jul. 24, 2013

(65) Prior Publication Data

US 2013/0306236 A1 Nov. 21, 2013

Related U.S. Application Data

(60) Division of application No. 13/457,717, filed on Apr. 27, 2012, which is a continuation of application No. PCT/JP2010/069355, filed on Oct. 29, 2010.

(30) Foreign Application Priority Data

Oct. 30, 2009 (JP) ................................. 2009-250335

(51) Int. Cl.
*B29C 71/04* (2006.01)
*A61L 2/08* (2006.01)
*A61L 24/00* (2006.01)
*C08G 61/04* (2006.01)
*C08F 2/46* (2006.01)

(52) U.S. Cl.
USPC ................. 522/71; 522/1; 522/189; 522/184; 520/1

(58) Field of Classification Search
USPC .............................. 522/71, 1, 189, 184; 520/1
See application file for complete search history.

(56) References Cited

U.S. PATENT DOCUMENTS

| 7,955,665 | B2 * | 6/2011 | Nishiyama et al. | 428/1.2 |
| 8,310,649 | B2 | 11/2012 | Niiyama et al. | |
| 2010/0189932 | A1 * | 7/2010 | Niiyama et al. | 428/34 |
| 2010/0215966 | A1 | 8/2010 | Ito et al. | |
| 2012/0107995 | A1 | 5/2012 | Niiyama et al. | |
| 2013/0004735 | A1 | 1/2013 | Ito et al. | |
| 2013/0011597 | A1 | 1/2013 | Niiyama et al. | |
| 2013/0029075 | A1 | 1/2013 | Niiyama et al. | |

FOREIGN PATENT DOCUMENTS

| JP | 03-126647 | | 5/1991 |
| JP | 04-149043 | | 5/1992 |
| JP | 06-151937 | | 5/1994 |
| JP | 09-187887 | | 7/1997 |
| JP | 2004-004612 | | 1/2004 |
| JP | 2006-273895 | | 10/2006 |
| WO | WO 2007/055316 | * | 5/2007 |
| WO | WO 2008/081838 | | 7/2008 |
| WO | WO 2009/016943 | | 2/2009 |

OTHER PUBLICATIONS

International Search Report issued Dec. 14, 2010 in PCT/JP2010/069355 filed Oct. 29, 2010.

* cited by examiner

*Primary Examiner* — Ling Choi
*Assistant Examiner* — Jessica E Whiteley
(74) *Attorney, Agent, or Firm* — Oblon, Spivak, McClelland, Maier & Neustadt, L.L.P.

(57) ABSTRACT

To provide a curable resin composition for forming a seal part, which is capable of easily forming a continuous seal part and which is capable of maintaining the shape of the seal part during a period of from immediately after the formation of an uncured seal part until a liquid material is supplied to a region enclosed by the seal part and the seal part is cured, and a laminate which has minimal defects and whereby a resin layer interposed between first and second plates can be made thick. One having a viscosity of from 500 to 3,000 Pa·s at 25° C. is used as the curable resin composition for forming a seal part to form an uncured seal part 12 enclosing the periphery of a liquid material (curable resin composition 14 for forming a resin layer) interposed between a first plate (display device 50) and a second plate (transparent plate 10).

10 Claims, 6 Drawing Sheets

CURABLE RESIN COMPOSITION FOR FORMING SEAL PART, LAMINATE AND PROCESS FOR ITS PRODUCTION

CROSS REFERENCE TO RELATED APPLICATIONS

This application is a division of U.S. patent application Ser. No. 13/457,717, filed Apr. 27, 2012, which is a continuation of International Patent Application No. PCT/JP10/069,355, filed Oct. 29, 2010, the disclosures of which are incorporated herein by reference in their entireties. This application claims priority to Japanese Patent Application No. 2009-250335, filed Oct. 30, 2009, the disclosure of which is incorporated herein by reference in its entirety.

TECHNICAL FIELD

The present invention relates to a curable resin composition to be suitably used for forming a sealing part at the time of producing a laminate (such as laminated glass, a display unit or a solar cell module) by curing a curable resin composition for forming a resin layer interposed between first and second plates in such a state that its periphery is enclosed by the seal part; a laminate having a seal part made of such a curable resin composition; and a process for producing such a laminate.

BACKGROUND ART

The following process has been proposed as a process for producing a transparent laminate such as laminated glass, wherein a resin layer is interposed between a pair of transparent plates.

A process for producing a transparent laminate, which comprises:

(a) a step of forming a seal part along the edge of the surface of one transparent plate, (b) a step of supplying a liquid curable resin composition for forming a resin layer to a region enclosed by the seal part, (c) a step of laminating the other transparent plate on the curable resin composition for forming a resin layer in a reduced-pressure atmosphere to obtain a laminate having the curable resin composition for forming a resin layer hermetically sealed by the pair of the transparent plates and the seal part, and (d) a step of curing the curable resin composition for forming a resin layer in such a state that the laminate is placed under the atmospheric pressure (Patent Documents 1 and 2).

And, the following methods are exemplified as the method for forming a seal part.

(1) A method of bonding a double sided adhesive tape along the edge of one transparent plate.

(2) A method of bonding a double sided adhesive tape along the edge of one transparent plate and applying a curable resin composition for forming a seal part on its upper surface.

(3) A method of applying a curable resin composition for forming a seal part, along the edge of one transparent plate.

(4) A method of applying a curable resin composition for forming a seal part having spacer particles mixed, along the edge of one transparent plate.

However, in the methods (1) and (2), it is necessary to cut the double sided adhesive tape at the time of bending the seal part at an angle of 90° at corners of the edge of the transparent plate, whereby a continuous seal part cannot be formed. Therefore, there will be a defect such that a curable resin composition for forming a resin layer leaks out from a space in the seal part.

Further, in the method (2), a plurality of steps are required for the formation of the seal part, such being cumbersome.

By the method (3), a seal part can easily be formed, but in order to bond the pair of transparent plates via the seal part without any space, it is necessary to cure the seal part after laminating the other transparent plate i.e. subsequent to the step (c). Therefore, during the step (b), it is likely that the curable resin composition for forming a seal part spreads in the width direction of the seal part and the shape of the uncured seal part deforms, whereby the height of the seal part cannot be sufficiently maintained. Therefore, it is difficult to make the curable resin composition for forming a resin layer to be supplied to the region enclosed by the seal part and the resin layer formed by curing it to be thick.

In the method (4), although it is possible to maintain the height of the seal part by the spacer particles, it is necessary to enlarge spacer particles when a thick resin layer is necessary, and if a curable resin composition for forming a seal part containing large spacer particles is applied by e.g. a dispenser, the dispensing portion is likely to be clogged with the spacer particles, and the application may not be smoothly carried out. Further, it is likely that the curable resin composition for forming a seal part flows out from the spacer to form spaces in the seal part, whereby a defect such as a leakage of the curable resin composition for forming a resin layer from the spaces in the seal part results.

PRIOR ART DOCUMENTS

Patent Documents

Patent Document 1: WO2008/081838
Patent Document 2: WO2009/016943

DISCLOSURE OF INVENTION

Object of the Invention

The present invention is to provide a curable resin composition for forming a seal part, which is capable of easily forming a continuous seal part and which is capable of maintaining the shape of the seal part during a period of from immediately after the formation of an uncured seal part until a liquid material is supplied to a region enclosed by the seal part and the seal part is cured; a laminate which has minimal defects and whereby the thickness of a resin layer interposed between first and second plates can be made thick; and a process for producing such a laminate.

Means to Accomplish the Object

The curable resin composition for forming a seal part of the present invention is a curable resin composition to form a seal part enclosing the periphery of a layer made of a liquid material interposed between first and second plates and characterized in that its viscosity at 25° C. is from 500 to 3,000 Pa·s.

The liquid material is preferably a curable resin composition for forming a resin layer.

The curable resin composition for forming a seal part of the present invention is preferably used to form a seal part at the time of producing a laminate by curing a curable resin composition for forming a resin layer interposed between first and second plates, in such a state that the periphery thereof is enclosed by the seal part.

The curable resin composition for forming a seal part of the present invention preferably comprises at least one oligomer (A) having a curable group and a number average molecular weight of from 30,000 to 100,000, and at least one monomer (B) having a curable group and a molecular weight of from 125 to 600, wherein the proportion of the monomer (B) is from 15 to 50 mass %, based on the total (100 mass %) of the oligomer (A) and the monomer (B).

Here, the monomer (B) is a low molecular weight curable compound contained in the curable resin composition for forming a seal part as a monomer, and such a monomer (B) does not include a monomer (B2) reacted with an isocyanate group of a prepolymer used for the following synthesis of an oligomer (A1), and includes a monomer (B2) remaining as unreacted.

The curable group is at least one type of group selected from the group consisting of an acryloyloxy group and a methacryloyloxy group.

The curable group of the oligomer (A) is more preferably an acryloyloxy group, and the curable group of the monomer (B) is more preferably a methacryloyloxy group.

The oligomer (A) is preferably an urethane oligomer (A1).

The curable resin composition for forming a seal part of the present invention preferably contains, as the monomer (B), a monomer (B1) not having a group reactive with an isocyanate group, wherein the urethane oligomer (A1) is one obtained by reacting a polyol with a polyisocyanate in the presence of the monomer (B1) to obtain a prepolymer having an isocyanate group, and then, reacting a monomer (B2) having a curable group and a group reactive with an isocyanate group, to the isocyanate group of the prepolymer.

The curable resin composition for forming a seal part of the present invention preferably contains, as the monomer (B), a monomer (B3) having a hydroxy group.

The curable resin composition for forming a seal part of the present invention is a photo-curable resin composition containing a photopolymerization initiator (C).

The curable resin composition for forming a seal part of the present invention may contain, as the photopolymerization initiator (C), at least two types of photopolymerization initiators different in the absorption wavelength region.

The laminate of the present invention comprises first and second plates, a resin layer interposed between the first and second plates, and a seal part enclosing the periphery of the resin layer, wherein the seal part is made of a cured product of the curable resin composition for forming a seal part of the present invention.

The width of the seal part of the laminate of the present invention is preferably from 0.3 to 3 mm.

The thickness of the seal part of the laminate of the present invention is preferably from 10 μm to 3 mm.

The laminate of the present invention may be a transparent laminate comprising first and second plates both being transparent plates, a resin layer interposed between the first and second plates, and a seal part enclosing the periphery of the resin layer.

The laminate of the present invention may be a display unit comprising first and second plates, of which one is a transparent plate and the other is a display device, a resin layer interposed between the first and second plates, and a seal part enclosing the periphery of the resin layer.

The laminate of the present invention may be a solar cell module comprising first and second plates, at least one of which is a transparent plate, a resin layer interposed between the first and second plates, a thin-film type solar cell device formed on the surface, on the resin layer side, of at least one of the first and second plates, and a seal part enclosing the periphery of the resin layer.

The laminate of the present invention may be a display unit comprising first and second plates, at least one of which is a transparent plate, a resin layer interposed between the first and second plates, a display device formed on the surface, on the resin layer side, of at least one of the first and second plates, and a seal part enclosing the periphery of the resin layer.

The process for producing a laminate of the present invention is a process for producing a laminate comprising first and second plates, a resin layer interposed between the first and second plates, and a seal part enclosing the periphery of the resin layer, and comprises the following steps (a) to (d):

(a) applying the curable resin composition for forming a seal part of the present invention along the edge of the surface of a first plate, to form an uncured seal part, (b) supplying a liquid curable resin composition for forming a resin layer to a region enclosed by the uncured seal part, (c) laminating a second plate on the curable resin composition for forming a resin layer in a reduced-pressure atmosphere of not more than 100 Pa, to obtain a laminate having the curable resin composition for forming a resin layer hermetically sealed by the first and second plates and the uncured seal part, and (d) curing the uncured seal part and the curable resin composition for forming a resin layer in such a state that the laminate is placed in a pressure atmosphere of at least 50 kPa.

In this specification, the laminate obtained in the above step (c), is one wherein the curable resin composition for forming a resin layer sealed by the first and second plates and the uncured seal part is not yet cured, and such a laminate may sometimes be referred to as a laminate precursor. However, such an uncured one as well as one wherein the composition for forming a resin layer is cured via the above step (d) will be referred to also as a laminate.

In the process for producing a laminate in the present invention, the thickness of the curable resin composition for forming a resin layer in the laminate obtained in the step (c) is preferably from 10 μm to 3 mm.

Advantageous Effects of Invention

By the curable resin composition for forming a seal part of the present invention, a continuous seal part can easily be formed, and the shape of the seal part can be maintained during a period of from immediately after the formation of an uncured seal part until a liquid material is supplied to a region enclosed by the seal part and the seal part is cured.

The laminate of the present invention has minimal defects and in the laminate, a resin layer interposed between first and second plates can be made thick.

According to the process for producing a laminate of the present invention, the resin layer enclosed by the first and second plates can be made thick, and it is possible to produce a laminate having minimal defects.

DESCRIPTION OF EMBODIMENTS

Figure 1:
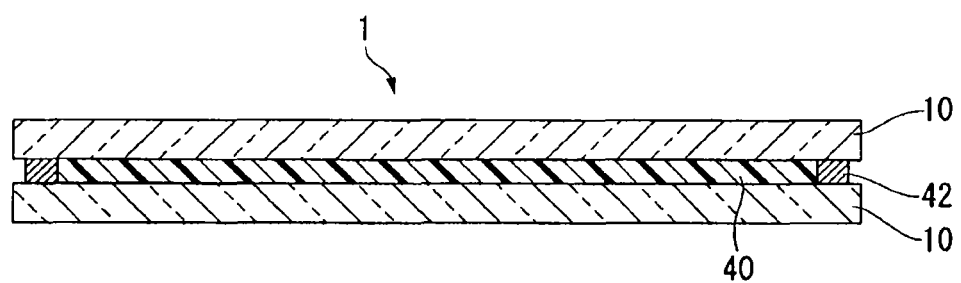
FIG. 1 is a cross-sectional view illustrating one embodiment of the transparent laminate of the present invention.

In the present invention, the following definitions will apply.

In a transparent laminate such as laminated glass, both plates are referred to as "plates".

In a display unit, a transparent plate to be a protective plate for a display device is referred to as "the front plate", and the display device is referred to as "the back plate".

In a solar cell module, the plate on the sunlight-incident side is referred to as "the front plate", and the other plate is referred to as "the back plate".

The front plate and the back plate are generally referred to as "plates".

Among the plates, the plate wherein a seal part is formed along its edge and a liquid curable resin composition is supplied to the region enclosed by the seal part in the process of the present invention, is referred to as "the first plate", and the plate to be laminated on the curable resin composition is referred to as "the second plate".

A plate having optical transparency is referred to as "a transparent plate".

A transparent plate made of glass is referred to as "a glass plate".

A plate having a thin-film type solar cell device formed on its surface is referred to as "a substrate", which is distinguished from a plate having no thin-film type solar cell device formed on its surface.

A transparent plate having a thin-film type solar cell device formed on its surface including the after-mentioned glass substrate and transparent resin substrate, is referred to as "a transparent substrate", which is distinguished from a transparent plate having no thin-film type solar cell device formed on its surface.

A glass plate having a thin-film type solar cell device formed on its surface is referred to as "a glass substrate", which is distinguished from a glass plate having no thin-film type solar cell device formed on its surface.

A transparent resin plate having a thin-film type solar cell device formed on its surface is referred to as "a transparent resin substrate", which is distinguished from a transparent resin substrate having no thin-film type solar cell device formed on its surface.

A non-transparent plate having a thin-film type solar cell device formed on its surface is referred to as "a non-transparent substrate".

<Curable Resin Composition for Forming Seal Part>

The curable resin composition for forming a seal part of the present invention is a curable resin composition to form a seal part enclosing the periphery of a layer made of a liquid material interposed between first and second plates, and it is suitable to form a seal part enclosing the periphery of a liquid curable resin composition for forming a resin layer interposed between first and second plates and is more suitably used to form a seal part at the time of producing a laminate by curing a curable resin composition for forming a resin layer interposed between first and second plates in such a state that its periphery is enclosed by the seal part.

The viscosity of the curable resin composition for forming a seal part of the present invention is, at 25° C., from 500 to 3,000 Pa·s, preferably from 800 to 2,500 Pa·s, more preferably from 1,000 to 2,000 Pa·s. When the viscosity is at least 500 Pa·s, the shape of an uncured seal part can be maintained for a relatively long time, and the height of the seal part can sufficiently be maintained. When the viscosity is at most 3,000 Pa·s, the seal part can be formed by coating.

The viscosity of the curable resin composition for forming a seal part is measured at 25° C. by means of an E type viscometer.

The curable resin composition for forming a seal part of the present invention is preferably one comprising at least one oligomer (A) having a curable group and a number average molecular weight of from 30,000 to 100,000, and at least one monomer (B) having a curable group and a molecular weight of from 125 to 600, wherein the proportion of the monomer (B) is from 15 to 50 mass % based on the total (100 mass %) of the oligomer (A) and the monomer (B), since the viscosity can easily be adjusted to be within the above range.

(Oligomer (A))

The number average molecular weight of the oligomer (A) is from 30,000 to 100,000, preferably from 40,000 to 80,000, more preferably from 50,000 to 65,000. When the number average molecular weight of the oligomer (A) is within such a range, the viscosity of the curable resin composition for forming a seal part can easily be adjusted to be within the above range.

The number average molecular weight of the oligomer (A) is a number average molecular weight calculated as polystyrene, obtained by GPC measurement. Here, in a case where in the GPC measurement, a peak of an unreacted low molecular weight component (such as a monomer) appears, the number average molecular weight is obtained by excluding such a peak.

The curable group of the oligomer (A) may, for example, be, as a photocurable group, an addition-polymerizable unsaturated group (such as an acryloyloxy group or a methacryloyloxy group) or a combination of an unsaturated group and a thiol group, or, as a thermosetting group, an epoxy group, and it is preferably one type of group selected from the group consisting of an acryloyloxy group and a methacryloyloxy group, from such a viewpoint that the curing rate is high and a highly transparent seal part can be obtained. Further, a curable group in a relatively high molecular weight oligomer (A) tends to have a low reactivity than a curable group in a relatively low molecular weight monomer (B), whereby curing of the monomer (B) is likely to proceed fast, so that the viscosity of the entire composition tends to be rapidly increased, and the curing reaction tends to be non-uniform. In order to minimize the difference in reactivity between the two curable groups thereby to obtain a uniform seal part, it is more preferred that the curable group of the oligomer (A) is an acryloyloxy group having a relatively high reactivity, and the curable group of the monomer (B) is a methacryloyloxy group having a relatively low reactivity.

The oligomer (A) is preferably one having an average of from 1.8 to 4 curable groups per molecule from the viewpoint of the curability of the curable resin composition for forming a seal part and the mechanical properties of the seal part.

The oligomer (A) may, for example, be an urethane oligomer having an urethane bond, a poly(meth)acrylate of a polyoxyalkylene polyol, or a poly(meth)acrylate of a polyester polyol, and it is preferably an urethane oligomer (A1) from such a viewpoint that the mechanical properties of the resin after curing, the adhesion with the plates, etc. can be widely adjusted by e.g. suitably designing urethane chain molecules.

An urethane oligomer (A1) having a number average molecular weight of from 30,000 to 100,000 has a high viscosity and is difficult to synthesize by a usual method, and even if it can be synthesized, mixing with the monomer (B) tends to be difficult. Therefore, in the present invention, it is preferred that the urethane oligomer (A1) is prepared by the following synthetic method, and the obtained product is used, as it is, as a curable resin composition for forming a seal part, or the obtained product is further diluted with the after-mentioned monomer (B) (such as monomer (B1) or monomer (B3)) and then used as a curable resin composition for forming a seal part.

(Synthetic Method for Urethane Oligomer (A1))

As a synthetic method for the urethane oligomer (A1), a method may be mentioned wherein in the presence of a monomer (B1) not having a group reactive with an isocyanate group being one type of the after-mentioned monomer (B), as a diluent, a polyol and a polyisocyanate are reacted to obtain a prepolymer having an isocyanate group, and then, to the isocyanate group of the prepolymer, a monomer (B2) having a curable group and a group reactive with an isocyanate group, is reacted.

As such polyol and polyisocyanate, known compounds, e.g. polyol (i), diisocyanate (ii), etc. disclosed as raw materials for urethane oligomer (A) in WO2009/016943 (incorporated in this application by reference) may, for example, be mentioned.

The monomer (B1) not having a group reactive with an isocyanate group may, for example, be an alkyl (meth)acrylate having an $C_{8-22}$ alkyl group (such as n-dodecyl (meth)acrylate, n-octadecyl (meth)acrylate or n-behenyl (meth)acrylate), or a (meth)acrylate having an alicyclic hydrocarbon group (such as isobornyl (meth)acrylate or adamantyl (meth)acrylate).

The monomer (B2) having a curable group and a group reactive with an isocyanate group may be a monomer having a curable group and an active hydrogen (such as a hydroxy group or an amino group). Specifically, it may, for example, be a hydroxyalkyl (meth)acrylate having a $C_{2-6}$ hydroxy alkyl group (such as 2-hydroxymethyl (meth)acrylate, 2-hydroxypropyl (meth)acrylate, or 2-hydroxybutyl (meth)acrylate), or 4-hydroxybutyl (meth)acrylate), and a hydroxyalkyl acrylate having a $C_{2-4}$ hydroxyalkyl group is preferred.

(Monomer (B))

The molecular weight of the monomer (B) is from 125 to 600, preferably from 140 to 400, more preferably from 150 to 350. When the molecular weight of the monomer (B) is at least 125, evaporation of the monomer (B) can be prevented at the time of producing a laminate by the after-mentioned reduced-pressure lamination method. When the molecular weight of the monomer (B) is at most 600, the solubility of the monomer (B) in the high molecular weight oligomer (A) can be increased, and it is possible to suitably adjust the viscosity as the curing resin composition for forming a seal part.

The curable group of the monomer (B) may, for example, be, as a photocurable group, an addition-polymerizable unsaturated group (such as an acryloyloxy group or a methacryloyloxy group) or a combination of an unsaturated group and a thiol group, or as a thermosetting group, an epoxy group, and it is preferably at least one group selected from the group consisting of an acryloyloxy group and a methacryloyloxy group from such a viewpoint that the curable rate is high, and a highly transparent seal part can be obtained. Further, a curable group in a relatively low molecular weight monomer (B) is likely to have a higher reactivity than a curable group in a relatively high molecular weight oligomer (A), whereby curing of the monomer (B) proceeds fast, so that the viscosity of the entire composition is likely to rapidly increase, and the curing reaction tends to be non-uniform. In order to obtain a uniform seal part, it is more preferred that the curable group of the monomer (B) is a methacryloyloxy group having a relatively low reactivity, and the curable group of the oligomer (A) is an acryloyloxy group having a relatively high reactivity.

The monomer (B) is preferably one having from 1 to 3 curable groups per molecule from the viewpoint of the curability of the curable resin composition for forming a seal part and the mechanical properties of the seal part.

The curable resin composition for forming a seal part of the present invention may contain, as the monomer (B), a monomer (B1) which is used as a diluent in the above described synthetic method for an urethane oligomer (A1). Further, it may contain, as the monomer (B), an unreacted monomer (B2) which is used for the above described synthetic method for an urethane oligomer (A1).

The monomer (B) preferably contains a monomer (B3) having a hydroxy group from the viewpoint of the adhesion between the plates and the seal part or the solubility of the after-mentioned various additives. The monomer (B3) having a hydroxy group is preferably a hydroxy methacrylate having from 1 to 2 hydroxy groups and a $C_{3-8}$ hydroxyalkyl group (such as 2-hydroxypropyl methacrylate, 2-hydroxybutyl methacrylate, 4-hydroxybutyl methacrylate or 6-hydroxyhexyl methacrylate), and 2-hydroxybutyl methacrylate is particularly preferred.

The proportion of the monomer (B) is from 15 to 50 mass %, preferably from 20 to 45 mass %, more preferably from 25 to 40 mass %, based on the total (100 mass %) of the oligomer (A) and the monomer (B). When the proportion of the monomer (B) is at least 15 mass %, the curability of the curable resin composition for forming a seal part and the adhesion between the face materials and the seal part will be good. When the proportion of the monomer (B) is at most 50 mass %, the viscosity of the curable resin composition for forming a seal part can be easily adjusted to be at least 500 Pa·s.

(Photopolymerization Initiator (C))

The curable resin composition for forming a seal part of the present invention may be a photocurable resin composition or a thermosetting resin composition. The curable resin composition for forming a seal part of the present invention is preferably a photocurable resin composition containing a photopolymerization initiator (C) from such a viewpoint that curing can be done at a low temperature, and the curing rate is high.

The photopolymerization initiator (C) may, for example, be a photopolymerization initiator of acetophenone type, ketal type, benzoin or benzoin ether type, phosphine oxide type, benzophenone type, thioxanthone type, quinone type, etc., and an acetophenone type or phosphine oxide type photopolymerization initiator is preferred. In a case where curing is carried out by a short wavelength visible light, a phosphine oxide type photopolymerization initiator is more preferred from the viewpoint of the absorption wavelength region. By using two or more types of photopolymerization initiators (C) different in the absorption wavelength region in combination, it is possible to further increase the surface curability at the seal part.

The amount of the photopolymerization initiator (C) is preferably from 0.01 to 10 parts by mass, more preferably from 0.1 to 2.5 parts by mass, per 100 parts by mass of the total of the oligomer (A) and the monomer (B).

(Various Additives)

The curable resin composition for forming a seal part of the present invention may contain various additives such as a polymerization inhibitor, a photocurability-accelerating agent, a chain transfer agent, a photostabilizer (such as an ultraviolet absorber or a radical-capturing agent), an antioxidant, a flame retardant, an adhesion-improving agent (such as a silane coupling agent), a pigment, a dye, etc., and it preferably contains a polymerization inhibitor or a photostabilizer. Especially, when a polymerization inhibitor is contained in an amount smaller than the polymerization initiator, the stability of the curable resin composition for forming a seal part can be improved, and it is possible to adjust the molecular weight of the resin layer after the curing.

The polymerization inhibitor may, for example, be a polymerization inhibitor of hydroquinone type (such as 2,5-di-t-butylhydroquinone), catechol type (such as p-t-butylcatechol), anthraquinone type, phenothiadine type, hydroxytoluene type or the like.

The photostabilizer may, for example, be an ultraviolet absorber (such as benzotriazole type, benzophenone type or salicylate type), or a radical-capturing agent (such as a hindered amine type).

The antioxidant may, for example, be a phosphorus or sulfur type compound.

The total amount of various additives is preferably at most 10 parts by mass, more preferably at most 5 parts by mass, per 100 parts by mass of the total of the oligomer (A) and the monomer (B).

(Advantageous Effects)

The curable resin composition for forming a seal part of the present invention as described above has a viscosity of at least 500 Pa·s, whereby the shape of the seal part can be maintained during the entire period of from immediately after the formation of an uncured seal part until a liquid material is supplied in the region enclosed by the seal part and the seal part is cured. Therefore, the height of the seal part can sufficiently be maintained, and the amount of the curable resin composition for forming a resin layer to be supplied to the region enclosed by the seal part and the thickness of a resin layer formed by curing it can be made to be certain levels. Further, the seal part can play a role of a dam for the liquid material for a period until the liquid material is supplied and cured. Further, it is possible to make the thickness of the resin layer to be relatively thick (specifically to a thickness of from about 10 μm to 3 mm).

Further, since the viscosity is at most 3,000 Pa·s, it is possible to form the seal part by coating. Therefore, it is possible to form a continuous seal part efficiently.

<Laminate>

The laminate of the present invention is one comprising first and second plates, a resin layer interposed between the first and second plates, and a seal part enclosing the periphery of the resin layer, wherein the seal part is made of a cured product of the curable resin composition for forming a seal part of the present invention.

The following ones may, for example, be mentioned as the laminate of the present invention.

Transparent laminate: comprising first and second plates both being transparent plates, a resin layer interposed between the first and second plates, and a seal part enclosing the periphery of the resin layer.

Display unit: comprising first and second plates, of which one is a transparent substrate material, and the other is a display device, a resin layer interposed between the first and the second plates, and a seal part enclosing the periphery of the resin layer.

Solar cell module: comprising first and second plates, at least one of which is a transparent plate, a resin layer interposed between the first and second plates, a thin-film type solar cell device formed on the surface, on the resin layer side, of at least one of the first and second plates, and a seal part enclosing the periphery of the resin layer.

As the transparent laminate, the following one may specifically be mentioned.

(α) A transparent laminate such as laminated glass or a transparent panel, wherein two "transparent plates" are plates (first embodiment).

As the display unit, the following one may specifically be mentioned.

(β) A display unit having a display device protected by a transparent plate, wherein "a transparent plate" being a protective plate for the display device is the front plate, and "the display device" is the back plate (second embodiment).

As the solar cell module, the following three may specifically be mentioned.

(γ) A solar cell module having one layer of thin-film type solar cell device, wherein "a transparent substrate" having a thin-film type solar cell device formed on its surface is the front plate, and "a plate" having no thin-film solar cell device formed on its surface is the back plate (third embodiment).

(δ) A solar cell module having one layer of thin-film type solar cell device wherein "a transparent plate" having no thin-film type solar cell device formed on its surface is the front plate, and "a substrate" having a thin-film type solar cell device formed on its surface is the back plate (fourth embodiment).

(ε) A solar cell module having two layers of thin-film type solar cell devices, wherein "a transparent substrate" having a thin-film type solar cell device formed on its surface is the front plate, and "a substrate" having a thin-film solar cell device formed on its surface is the back plate (fifth embodiment).

[First Embodiment]

FIG. 1 is a cross-sectional view illustrating one embodiment of the transparent laminate of the present invention. A transparent laminate 1 comprises two transparent plates 10 (first and second plates) being plates, a resin layer 40 interposed between the two transparent plates 10, and a seal part 42 enclosing the periphery of the resin layer 40.

(Plates)

The plates are transparent plates to transmit light.

The transparent plates may be glass plates or transparent resin plates. When glass plates are used, they constitute laminated glass, and when transparent resin plates are used, they constitute a transparent panel. A glass plate and a transparent resin plate may be used in combination.

Further, a part or whole of a transparent plate may be colored, or may be made to scatter light like ground-glass or to reflect or refract transmitting light by fine irregularities, etc. of the surface. Otherwise, an optical film showing such a function, or an optical film to carry out optical modulation, such as a polarizing film or the like, may be bonded to a transparent plate to form an integral product, which may be used as a transparent plate.

The material for the glass plate may be a glass material such as soda lime glass.

The material for the transparent resin plate may be a highly transparent resin material (such as a polycarbonate or a polymethyl methacrylate).

The thickness of the transparent plate is usually preferably from 0.3 to 6 mm, more preferably from 1 to 6 mm, in the case of a glass plate, from the viewpoint of the mechanical strength and transparency. Especially when a thin transparent laminate is required, the thickness of the glass plate is preferably from 0.3 to 1.5 mm, more preferably from 0.3 to 1 mm. Further, in the case of a transparent resin plate, the thickness is usually from 0.1 to 3 mm.

(Resin Layer)

The resin layer is a layer to play a role to bond the laminated front and back plates and is a layer formed by curing the after-mentioned liquid curable resin composition for forming a resin layer.

The thickness of the resin layer is preferably from 0.2 to 3 mm. When the thickness of the resin layer is at least 0.2 mm, the mechanical strength of the transparent laminate will be good. Especially, the thickness of the resin layer is more preferably from 0.2 to 1.5 mm, further preferably from 0.2 to 0.8 mm. Here, by curing, the thickness of the resin layer becomes thin, and accordingly, at the time of application, the thickness of the resin layer is preferably at a level of from 1.2 to 2 times the thickness after curing.

As a method for adjusting the thickness of the resin layer, a method of adjusting the thickness of the after-mentioned seal part may be mentioned. At the uncured seal part, spacer particles having a predetermined particle size may be disposed.

(Seal Part)

The seal part is one formed by applying and curing the curable resin composition for forming a seal part of the present invention. In the case of the transparent laminate, the width of the seal part is preferably from 0.3 to 3 mm, more preferably from 0.5 to 2 mm. Further, the thickness of the seal part is preferably from 0.3 to 3.2 mm, more preferably from 0.3 to 1.6 mm.

(Shape)

The size of the transparent laminate is not particularly limited, but a transparent substrate having at least one of sides being at least 300 mm, more preferably at least 600 mm, may be widely used as a transparent member to be installed at an opening for buildings or vehicles. In usual application, a size of at most 4 m² is suitable.

[Second Embodiment]

Figure 2:
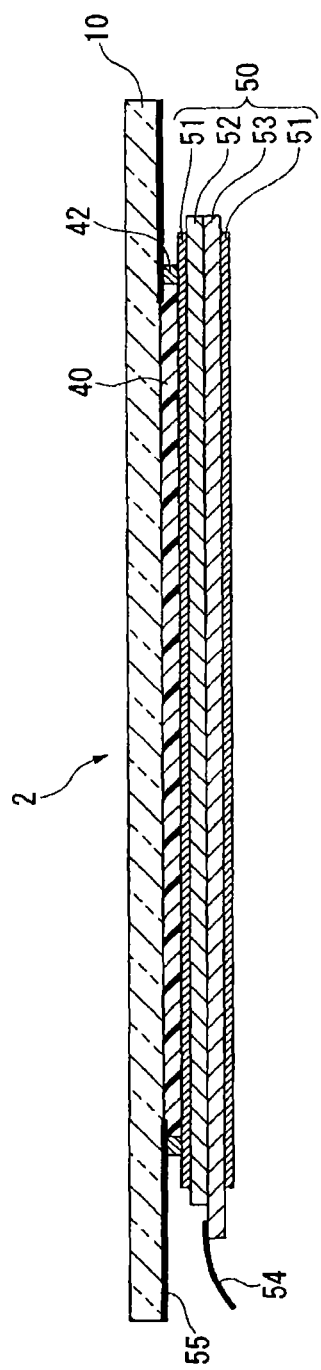
FIG. 2 is a cross-sectional view illustrating one embodiment of the display unit of the present invention.

FIG. 2 is a cross-sectional view illustrating an embodiment of the display unit of the present invention.

A display unit 2 comprises a transparent plate 10 being a front plate, a display device 50 being a back plate, a resin layer 40 interposed between the transparent plate 10 and the display device 50, a seal part 42 enclosing the periphery of the resin layer 40, a flexible printed circuit board 54 (FPC) connected to the display device 50 and mounting a driving IC to drive the display device 50, and a light-shielding print portion 55 formed along the edge of the transparent plate 10. Here, in a case where the transparent plate 10 being the above front plate becomes a second plate, the display device 50 being the back plate becomes the first plate, and in a case where the transparent plate 10 being the above front plate becomes the first plate, the display device 50 being the back plate becomes the second plate.

(Front Plate)

The front plate is a transparent plate to transmit a display image of the display device.

The transparent plate may be a glass plate or a transparent resin plate, and it is most preferably a glass plate from such a viewpoint that not only the transparency to reflected light or emitted light from the display device is high, but also it has light stability, low birefringence, high flat surface precision, surface scratching resistance and high mechanical strength. The transparent plate is preferred also from such a viewpoint that it transmits light to cure a photocurable resin composition.

The material for the glass plate may be glass material such as soda lime glass, and highly transparent glass (white plate glass) with a lower iron content and less bluish color, is more preferred. In order to increase the safety, reinforced glass may be used as the front plate.

The material for the transparent resin plate may be a highly transparent resin material (such as a polycarbonate or a polymethyl methacrylate).

To the transparent plate, surface treatment may be applied in order to improve the interface adhesive strength with the resin layer. As a method of surface treatment, a method of treating the surface of the transparent plate with a silane coupling agent may, for example, be mentioned. To the transparent plate, an antireflection layer may be formed on the back side of the bonded side with the resin layer, in order to increase the contrast of the display image. Such an antireflection layer may be formed by a method of directly forming an inorganic thin film on the surface of the transparent plate, or a method of bonding a transparent resin film provided with an antireflection layer, to the transparent plate. Further, depending upon the purpose of the image display, in the same manner as in the first embodiment, a part or whole of the transparent plate may be colored, or may be made to scatter light like ground-glass or to reflect or refract transmitting light by fine irregularities, etc. on the surface. Otherwise, an optical film having such a function or an optical film to carry out optical modulation, such as a polarizing film or the like, may be bonded to the transparent plate to form an integral product, which may be used as the transparent plate.

The thickness of the transparent plate is usually from 0.5 to 25 mm in the case of the glass plate from the viewpoint of the mechanical strength and the transparency. In an application to e.g. a TV receiver to be used indoors, a PC display, etc., it is preferably from 1 to 6 mm from the viewpoint of the weight reduction of the display unit, and in an application for a public display to be installed outdoors, it is preferably from 3 to 20 mm. In the case of the transparent resin plate, the thickness is preferably from 2 to 10 mm.

(Back Plate)

The back plate is a display device.

The illustrated display device 50 is an example of a liquid crystal display device of a structure wherein a transparent plate 52 provided with a color filter and a transparent plate 53 provided with TFT are bonded along the peripheral portion of the two plates via a liquid crystal layer, and this assembly is sandwiched between a pair of polarizing plates 51. However, in the present invention, the display device is not limited to the illustrated one.

The display device is one wherein a display material, of which the optical state is changed by an external electrical signal, is interposed between a pair of electrodes, of which at least one is a transparent electrode. Depending upon the type of the display material, the display device may be a liquid crystal display device, an EL display device, a plasma display device, an electronic ink display device, etc. Further, the display device has a structure wherein a pair of plates, of which at least one is a transparent plate, are bonded to each other and are disposed so that the transparent plate side is in contact with the resin layer. At that time, in some display devices, an optical film such as a polarizing film or a retardation film may be formed on the outermost layer side of the transparent plate on the side in contact with the resin layer. In such a case, the resin layer takes a form to bond the front plate and the optical film on the display device.

To the surface of the display device to be bonded to the resin layer, surface treatment may be applied in order to improve the interface bond strength with the seal part. Such surface treatment may be applied only along the edge or to the entire surface of the plate. As a method for such surface treatment, a method of treating with e.g. a low temperature processable bonding primer may, for example, be mentioned.

The thickness of the display device is usually from 0.4 to 4 mm in the case of a liquid display device to be operated by TFT, or usually from 0.2 to 3 mm in the case of an EL display device.

(Resin Layer)

The resin layer is a layer which plays a role of bonding the laminated front plate and back plate, and it is a layer formed by curing the after-described liquid curable resin composition for forming a resin layer. In the display unit, as compared with other embodiments, a curable resin composition for forming a resin layer, of which the elastic modulus of the resin after curing becomes low, is preferred. If the elastic modulus of the resin is high, at the time of curing of the resin, a stress formed by e.g. curing shrinkage is likely to present an adverse effect to the display performance of the display device.

The thickness of the resin layer is preferably from 0.03 to 2 mm, more preferably from 0.1 to 0.8 mm. When the thickness of the resin layer is at least 0.03 mm, the resin layer will effectively buffer e.g. an impact by an external force from the transparent plate side to protect the display device. Further, in the process of the present invention, even if a foreign matter exceeding the thickness of the resin layer is included between the transparent plate and the display device, the thickness of the resin layer may not be substantially changed, whereby an influence over the light transmittance is little. When the thickness of the resin layer is at most 2 mm, air bubbles are less likely to remain in the resin layer, and the entire thickness of the display unit will not be unnecessarily thick.

As a method for adjusting the thickness of the resin layer, a method of adjusting the amount of the liquid curable resin composition for forming a resin layer to be supplied to the first plate may be mentioned as well as adjusting the thickness of the seal part which will be described below.

(Seal Part)

The seal part is one formed by applying and curing the curable resin composition for forming a seal part of the present invention. The region outside of the image display region of the display device is relatively narrow, and therefore, the width of the seal part is preferably made narrow. The width of the seal part is preferably from 0.3 to 3 mm, more preferably from 0.5 to 2 mm. Further, the thickness of the seal part is preferably from 0.1 to 2.2 mm, more preferably from 0.2 to 0.9 mm.

(Light-Shielding Print Portion)

The light-shielding print portion is one to make other than the image display region of the display device not to be seen from the transparent plate side thereby to shield e.g. a wiring component connected to the display device. The light-shielding print portion may be formed on the surface of the transparent plate to be bonded to the resin layer or on its back surface, and with a view to reducing the parallax between the light-shielding print portion and the image display region, it is preferably formed on the bonding surface of the transparent plate to the resin layer. In a case where the transparent plate is a glass plate, it is preferred to employ ceramic printing containing a black pigment at the light-shielding print portion, whereby the light-shielding property will be high.

(Shape)

The shape of the display unit is usually rectangular.

Since the process of the present invention is suitable particularly for the production of a display unit having a relatively large area, the size of the display unit is suitably at least 0.5 m×0.4 m, particularly preferably at least 0.7 m×0.4 m, in the case of a TV receiver employing a liquid crystal display device. The upper limit in the size of the display unit is determined in many cases by the size of the display device. Further, if the display unit is too large, its handling in e.g. installation tends to be difficult. From such restrictions, the upper limit in the size of the display unit is usually at a level of 2.5 m×1.5 m.

The sizes of the display device and the transparent plate being a protective plate may be substantially equal, but from the relation with other housing to accommodate the display unit, the transparent plate may be slightly larger than the display device in many cases. On the contrary, depending upon the structure of other housing, the transparent plate may be made slightly smaller than the display device.

[Third Embodiment]

Figure 3:
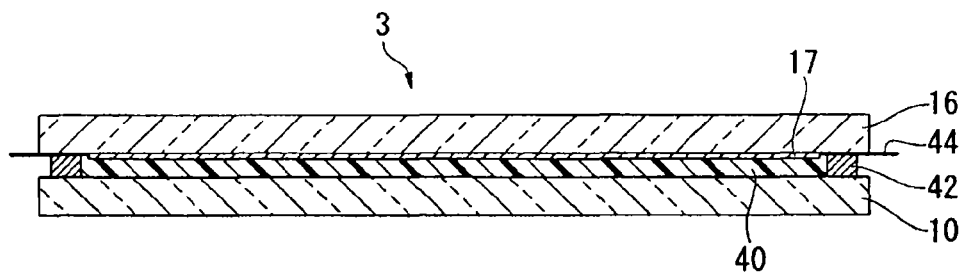
FIG. 3 is a cross-sectional view illustrating one embodiment of the solar cell module of the present invention.

FIG. 3 is a cross-sectional view illustrating one embodiment of the solar cell module of the present invention.

The solar cell module 3 comprises a glass substrate 16 as the front plate, a transparent plate 10 as the back plate, a resin layer 40 interposed between the glass substrate 16 and the transparent plate 10, a thin-film type solar cell device 17 formed on the surface of the glass substrate 16 on the resin layer 40 side, a seal part 42 enclosing the periphery of the resin layer 40, and an electric wire 44 connected to the thin-film type solar cell device 17 and extending through the seal part 42 to the exterior. Here, in a case where the glass substrate 16 as the above front plate becomes a second plate, the transparent plate 10 as the back plate becomes a first plate, and in a case where the glass substrate 16 as the above front plate becomes a first plate, the transparent plate 10 as the back plate becomes a second plate.

(Front Plate)

The front plate is a transparent substrate which transmits sunlight.

The transparent substrate has a thin-film type solar cell device formed on the surface at the region excluding its edge.

To the transparent plate, surface treatment may be applied to improve the interface bonding strength with the seal part. Such surface treatment may be applied only along the edge or may be applied on the entire surface of the plate. The method for the surface treatment may, for example, be a method of treating the surface of the transparent plate with a silane coupling agent.

In the same manner as in the first embodiment, a part or whole of the transparent plate may be colored or may be made to scatter light like ground-glass or to reflect or refract transmitting light by fine irregularities, etc. on the surface. Otherwise, an optical film having such a function or an optical film to carry out optical modulation such as a wavelength conversion film may be bonded to the transparent plate to form an integral product which may be used as a transparent plate.

As the transparent substrate, the illustrated glass substrate 16 or a transparent resin substrate may be mentioned, and a glass substrate is most preferred not only from the viewpoint such that the transparency to sunlight is high, but also from such a viewpoint that it has durability against the production process of a thin-film type solar cell device such as heat resistance, light stability, weather resistance, corrosion resistance, scratch resistance and high mechanical strength.

As the material for the glass substrate, a glass material such as soda lime glass may, for example, be mentioned.

As the material for the transparent resin substrate, a highly transparent resin material (such as a polycarbonate or a polymethyl methacrylate) may be mentioned. In the case of using a transparent resin substrate, it is required to form a thin-film type solar cell device on the substrate at a temperature of not higher than the heat resistant temperature of the transparent resin substrate.

The thickness of the transparent substrate including the thickness of the thin-film type solar cell device is usually from 0.7 to 6 mm in the case of a glass substrate, and is usually from 0.1 to 3 mm in the case of a transparent resin substrate. In such a thickness, the thickness of the thin-film type solar cell device is usually not more than 10 μm.

As the glass substrate in the present invention, a commercially available glass substrate having a thin-film type solar cell device may be obtained and used.

(Thin-Film Type Solar Cell Device)

A thin-film type solar cell device is formed on the surface of the transparent substrate at the region excluding the edge. Further, wiring terminals to take out an electric power from the thin-film type solar cell device are formed at the edge on the surface of the transparent substrate. The after-described seal part is provided at the edge of the transparent substrate where the thin-film type solar cell device is not formed and overlaps with part of the surface of wirings or part of the surface of the terminals.

The thin-film type solar cell device is formed by carrying out patterning every time when the respective layers of a transparent electrode layer, a photoelectric conversion layer and a backside electrode layer are formed on the surface of a transparent plate.

The material for the transparent electrode layer may, for example, be indium tin oxide or tin oxide.

The photoelectric conversion layer is a layer made of a thin film semiconductor. The thin film semiconductor may, for example, be an amorphous silicon type semiconductor, fine crystal silicon type semiconductor, a compound semiconductor (such as a chalcopyrite type semiconductor or CdTe type semiconductor) or an organic type semiconductor.

The material for the backside electrode layer may, for example, be a material having no optical transparency (such as silver or aluminum) or a material having optical transparency (such as indium tin oxide, tin oxide or zinc oxide).

As the thin-film type solar cell device, in a case where a photoelectric conversion layer is formed on a transparent electrode layer to carry out power generation by incident light from the plate, a thin-film silicon solar cell device is preferred wherein the thin film semiconductor is an amorphous silicon type semiconductor.

(Back Plate)

As the back plate, the transparent plate 10 as shown in the drawings is preferred, since it transmits light to cure the photocurable resin composition. However, in a case where the thin-film type solar cell device has optical transparency, (i.e. in a case where the material for the backside electrode layer is optically transparent indium tin oxide or tin oxide), light to cure the photocurable resin composition can be transmitted from the front plate side, whereby the rear plate may be a non-transparent plate (such as a metal plate or a ceramics plate).

The transparent plate may have sufficient transparency to let light transmit to cure the photocurable resin composition. Further, the transparent plate may have the weather resistance, corrosion resistance and high mechanical strength required for the back plate. As such a transparent plate, a glass plate or a transparent resin plate may be mentioned, and a glass plate is preferred since the gas permeability is low, and it has high mechanical strength.

The material for the glass plate may be the same as the above-mentioned material for the glass substrate.

The material for the transparent resin plate may be a resin material to let light transmit to cure the photocurable resin composition, and in addition to the above-mentioned resin material having high transparency, a resin material having low transparency to light other than ultraviolet rays and visible light of at most 450 nm may be used.

To the transparent plate, surface treatment may be applied in order to improve the interface bonding strength with the resin layer. The method for such surface treatment may, for example, be a method of treating the surface of a glass plate with a silane coupling agent.

The thickness of the transparent plate is usually from 0.7 to 6 mm in the case of a glass plate, and usually from 0.1 to 3 mm in the case of a transparent resin plate, from the viewpoint of the mechanical strength and transparency.

(Resin Layer)

The resin layer is a layer which plays a role of bonding the laminated front plate and back plate, and it is a layer formed by curing the after-described liquid curable resin composition for forming a resin layer.

The thickness of the resin layer is preferably from 0.01 to 2 mm, particularly preferably from 0.1 to 0.8 mm.

A method for adjusting the thickness of the resin layer may, for example, be a method of adjusting the thickness of the after-described seal part. The resin layer is preferably excellent in the transparency.

(Seal Part)

The seal part is one formed by applying and curing the curable resin composition for forming a seal part of the present invention. In the case of the above-described solar cell module, the width of the seal part is preferably from 0.3 to 3 mm, more preferably from 0.5 to 2 mm. Further, the thickness of the seal part is preferably from 0.1 to 2.2 mm, more preferably from 0.2 to 0.9 mm.

(Shape)

The shape of a solar cell module is usually rectangular.

Since the process of the present invention is suitable particularly for the production of a solar cell module having a large area, the size of the solar cell module is suitably at least 0.6 m×0.6 m, preferably at least 0.8 m×0.8 m. The upper limit in the size of the solar cell module is determined in many cases by the limitation in size of the production apparatus such as a reduced-pressure apparatus. Further, if the solar cell module is too large, its handling in e.g. installation tends to be difficult. From such restrictions, the upper limit in the size of the solar cell module is usually at a level of 3 m×3 m.

The shape and size of the front plate and the back plate are substantially equal to the shape and size of the solar cell module, and the shapes or sizes of the front plate and the back plate may be different to some extent.

[Fourth Embodiment]

Figure 4:
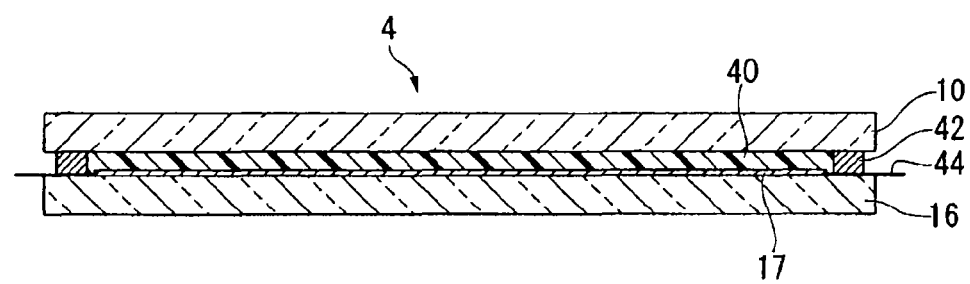
FIG. 4 is a cross-sectional view illustrating another embodiment of the solar cell module of the present invention.

FIG. 4 is a cross-sectional view illustrating another embodiment of the solar cell module of the present invention.

The solar cell module 4 comprises a transparent plate 10 as the front plate, a glass substrate 16 as the back plate, a resin layer 40 interposed between the transparent plate 10 and the glass substrate 16, a thin-film type solar cell device 17 formed on the surface, on the resin layer 40 side, of the glass substrate 16, a seal part 42 enclosing the periphery of the resin layer 40, and an electric wire 44 connected to the thin-film type solar cell device 17 and extending through the seal part 42 to the exterior. Here, in a case where the transparent plate 10 as the above front plate becomes a second plate, the glass substrate 16 as the back plate becomes a first plate, and in a case where the transparent plate 10 as the above plate becomes a first plate, the glass substrate 16 as the back plate becomes a second plate.

In the fourth embodiment, with respect to the same construction as in the third embodiment, its description will be omitted.

(Front Plate)

The front plate is a transparent material which transmits sunlight.

The transparent plate may, for example, be a glass plate or a transparent resin plate, and a glass plate is most preferred not only from such a viewpoint that the transparency to sunlight is high, but also from such a viewpoint that it has light stability, weather resistance, corrosion resistance, scratch resistance and high mechanical strength. A transparent plate is preferred also from such a viewpoint that the photocurable resin composition can be cured by incident light from the front plate.

As the material for the glass plate, a glass material such as soda lime glass, may for example, be mentioned, and a highly transparent glass (white plate glass) having a lower iron content with a lower bluish color is more preferred. As the front plate, reinforced glass may be employed in order to increase the safety.

The material for a transparent resin plate may, for example, be a highly transparent resin material (such as a polycarbonate or a polymethyl methacrylate).

To the transparent plate, surface treatment may be applied in order to improve the interface bonding strength with the resin layer. A method for such surface treatment may, for example, be a method of treating the surface of a glass plate with a silane coupling agent.

The thickness of the transparent plate is usually from 1 to 6 mm in the case of a glass plate, and usually from 0.1 to 3 mm in the case of a transparent resin plate, from the viewpoint of the mechanical strength and transparency.

(Back Plate)

As the back plate, a glass substrate is preferred from such a viewpoint that a thin-film type solar cell device is preferably formed on its surface. However, a resin substrate may also be employed, in a case where the thin-film type solar cell device can be formed at a temperature lower than the heat resistant temperature of the resin plate e.g. by applying an ink containing a compound semiconductor, or a non-transparent substrate (such as a substrate having a solar cell device formed on the surface of a metal plate of e.g. stainless steel provided with an insulating layer or a ceramics plate) may be used.

The transparent substrate may have weather resistance, corrosion resistance, high mechanical strength, etc. required for the back plate. As such a transparent substrate, a glass substrate using a glass plate of e.g. soda lime glass is preferred.

As the material for the glass plate for the glass substrate, the same as the material for the above-described glass plate may be mentioned.

As the glass substrate in the present invention, a commercially available glass substrate having a thin-film type solar cell device may be obtained and used.

On the transparent substrate, a thin-film type solar cell device is formed on its surface at the region excluding the edge.

To the transparent substrate, surface treatment may be applied in order to improve the interface bonding strength with the seal part. Such surface treatment may be applied only along the edge or on the entire surface of the plate. A method for the surface treatment may, for example, be a method of treating the surface of the transparent plate with a silane coupling agent.

The thickness of the transparent substrate including the thickness of the thin-film type solar cell device is usually from 1 to 6 mm in the case of a glass substrate and usually from 0.1 to 3 mm in the case of a transparent resin substrate or a non-transparent substrate using a metal substrate provided with an insulating layer. In such a thickness, the thickness of the thin-film type solar cell device is usually not more than 10 µm.

(Thin-Film Type Solar Cell Device)

The thin-film type solar cell device is formed by carrying out patterning every time when the respective layers of the backside electrode layer, the photoelectric conversion layer and the transparent electrode layer on the surface of the transparent plate. As the case requires, a buffer layer may be formed between the photoelectric conversion layer and the transparent electrode layer. As a thin-film type solar cell device wherein power generation is carried out by incident light from the transparent electrode layer as the uppermost layer, a chalcopyrite type or CdTe type compound semiconductor solar cell device is preferred. In a case where the chalcopyrite type semiconductor is $CuInGaSe_2$, CdS or ZnO can be used as the buffer layer.

[Fifth Embodiment]

Figure 5:
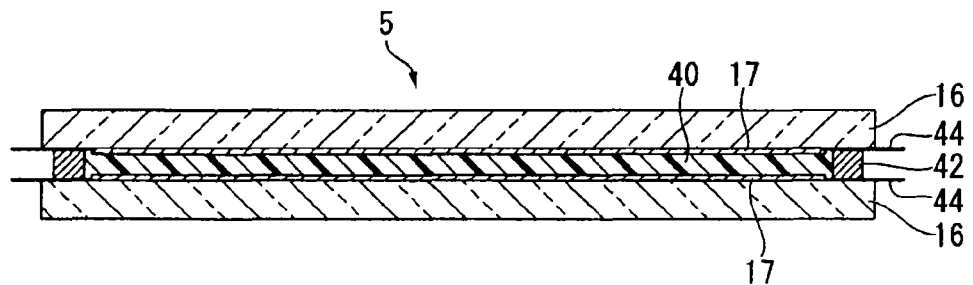
FIG. 5 is a cross-sectional view illustrating another embodiment of the solar cell module of the present invention.

FIG. 5 is a cross-sectional view illustrating another embodiment of the solar cell module of the present invention.

The solar cell module 5 comprises a glass substrate 16 as the front plate, a glass substrate 16 as the back plate, a resin layer 40 interposed between the pair of glass substrates, a total of two layer thin-film type solar cell devices 17 formed on the surfaces, on the resin layer 40 side, of the respective glass substrates 16, a seal part 42 enclosing the periphery of the resin layer 40, and electric wires 44 connected to the thin-film type solar cell devices 17 and extend through the seal part 42 to the exterior. Here, in a case where the glass substrate 16 as the above front plate becomes a second plate, the glass substrate 16 as the back plate becomes a first plate, and in a case where the glass substrate 16 as the above front plate becomes a first plate, the glass substrate 16 as the back plate becomes a second plate.

As the glass substrate in the present invention, a commercially available glass substrate having a thin-film type solar cell device may be obtained and used.

In the fifth embodiment, with respect to the same construction as in the third embodiment and the fourth embodiment, its description will be omitted.

(Plates)

As the front plate, it is possible to employ the same transparent substrate as the front plate in the first embodiment, and the glass substrate 16 as shown in the drawings is most preferred.

As the back plate, it is possible to employ the same substrate (the transparent substrate or the non-transparent substrate) as the back plate in the second embodiment, and a transparent substrate is preferred, and the glass substrate 16 as shown in the drawings is more preferred.

(Thin-Film Type Solar Cell Device)

The thin-film type solar cell device on the front plate side is formed by carrying out patterning every time when the respective layers of the transparent electrode layer, the photoelectric conversion layer and the backside electrode layer are formed on the surface of a transparent plate.

As the material for the backside electrode layer, it is necessary to employ a material having optical transparency (such as indium tin oxide or tin oxide) in order to let at least part of sunlight transmit to the thin-film type solar cell device on the back plate side. In such a case, a thin-film silicon solar cell device is preferred wherein the thin-film semiconductor is an amorphous silicon type semiconductor.

The thin-film type solar cell device on the back plate side is formed by carrying out patterning every time when the respective layers of the backside electrode layer, the photoelectric conversion layer and the transparent electrode layer are formed on the surface of the transparent plate. From the viewpoint of utilizing incident light from the transparent electrode layer, as the thin-film semiconductor, a chalcopyrite type or CdTe type compound semiconductor solar cell device is preferred.

As the material for the backside electrode layer, it is required to employ a material having optical transparency (such as indium tin oxide or tin oxide) in a case where light to cure the photocurable resin composition is transmitted from the back plate side.

Further, as the back plate, it is possible to employ the same transparent substrate as the front plate. In such a case, it is possible to utilize incident light from the front plate and the back plate for power generation.

(Advantageous Effects)

In the laminate of the present invention as described above, the seal part is made of a cured product of the curable resin composition for forming a seal part of the present invention, whereby the height of the seal part is sufficiently maintained. Therefore, the thickness of the resin layer interposed between the first and second plates can be made thick. Specifically, the thickness can be made to be from 10 μm to 3 mm. Further, since the seal part is made of a cured product of the curable resin composition for forming a seal part of the present invention, the seal part is continuous without a space. Therefore, such a defect that the curable resin composition for forming a resin layer as the raw material for the resin layer leaks out during the production, is less likely to occur.

<Process for Producing Laminate>

The process for producing a laminate of the present invention is a process comprising the following steps (a) to (d):

(a) A step of applying the curable resin composition for forming a seal part of the present invention along the edge of the surface of a first plate, to form an uncured seal part (provided that in a case where a thin-film type solar cell device is formed on a surface of the first plate, the seal part is formed on the surface on the side where the thin-film solar cell device is formed, or in a case where the first plate is a display device, the seal part is formed on the surface on the side where the image is displayed), and the above first plate may become a back plate or may become a front plate, (b) A step of applying a liquid curable resin composition for forming a resin layer to a region enclosed by the uncured seal part, (c) A step of laminating a second plate on the curable resin composition for forming a resin layer in a reduced-pressure atmosphere of not more than 100 Pa, to obtain a laminate having the curable resin composition for forming a resin layer hermetically sealed by the first and second plates and the uncured seal part (provided that in a case where a thin-film type solar cell device is formed on a surface of the second plate, the lamination is carried out so that the surface on the side where the thin-film type solar cell device is formed, is in contact with the curable resin composition for forming a resin layer, or in a case where an antireflection film is formed on a surface of the second plate, the lamination is carried out so that the surface of the back surface side is in contact with the curable resin composition for forming a resin layer, or in a case where the second plate is a display device, the lamination is carried out so that the side where the image is displayed, is in contact with the curable resin composition for forming a resin layer), and the second plate may become a front plate or may become a back plate, (d) A step of curing the uncured seal part and the curable resin composition for forming a resin layer in such a state that the laminate is placed in a pressure atmosphere of at least 50 kPa.

The process of the present invention is a process wherein the liquid curable resin composition for forming a resin layer is sealed between the first and second plates in a reduced-pressure atmosphere, and then, the sealed curable resin composition for forming a resin layer is cured in a high pressure atmosphere such as an atmospheric air atmosphere to form the resin layer. The sealing of the curable resin composition for forming a resin layer under reduced-pressure is not a method of injecting the curable resin for forming a resin layer to a wide space with a narrow gap between the first and second plates but a method for supplying the curable resin composition for forming a resin layer substantially over the entire surface of the first plate and then laminating the second plate to seal the curable resin composition for forming a resin layer between the first and second plates.

With respect to the method for sealing a liquid curable resin composition for forming a resin layer under reduced-pressure and curing the curable resin composition for forming a resin layer under atmospheric pressure, reference is made, for example, to the method for producing a transparent laminate and the photocurable resin composition to be used in the method, as disclosed in WO2008/81838 or WO2009/16943 (which are incorporated in this application by reference).

(Step (a))

Firstly, an uncured seal part is formed along the peripheral portion on one surface of the first plate. It is optional to use the back plate or the front plate as the first plate.

In a case where the first plate is "a plate" having no thin-film type solar cell device formed thereon, or "a transparent plate" to be a protective plate for a display device, the surface on which the uncured seal part is to be formed is either one of the two surfaces. In a case where the two surfaces are different in nature, one surface having a necessary nature is selected for use. For example, in a case where surface treatment to improve the interface bonding strength with the resin layer is applied to one surface, the uncured seal part is formed on such a surface. Further, in a case where an antireflection layer is formed on one surface, the uncured seal part is formed on the rear side thereof.

In a case where the first plate is "a substrate" having a thin-film type solar cell device formed thereon, the surface on which the uncured seal part is to be formed, is the surface on the side where the thin-film type solar cell device is formed. In a case where the first plate is a display device, the surface on which the uncured seal part is to be formed, is the surface on the side where an image is to be displayed.

The uncured seal part is preferably formed to have an interface bonding strength sufficient to prevent leakage of the liquid curable resin composition for forming a resin layer from the interface of the uncured seal part and the first plate and from the interface between the uncured seal part and the second plate in the after-described step (c), and rigidity sufficient to maintain the shape. The uncured seal part is formed by using the curable resin composition for forming a seal part of the present invention i.e. by applying it by means of printing, dispensing, or the like.

Further, in order to maintain a space between the first and second plates, spacer particles having a predetermined particle size may be incorporated to the curable resin composition for forming a seal part.

(Step (b))

After the step (a), a liquid curable resin composition is supplied to the region enclosed by the uncured seal part.

The amount of the curable resin composition for forming a resin layer to be supplied is preliminarily set to be such an amount that the space formed by the seal part and the first and second plates is filled by the curable resin composition, and the space between the first and second plates is a prescribed distance (i.e. the resin layer is made to have a prescribed thickness). At that time, it is preferred to preliminarily take into consideration the volume reduction due to curing shrinkage of the curable resin composition for forming a resin layer. Therefore, the amount is preferably such an amount that the thickness of the curable resin composition for forming a resin layer becomes slightly thicker than the prescribed thickness of the resin layer.

The supplying method may, for example, be a method wherein the first plate is placed horizontal, and the curable resin composition is supplied in a dot shape, in a line shape or in a planar shape by a supplying means such as a dispenser or a die coater.

The viscosity of the curable resin composition for forming a resin layer is preferably from 0.05 to 50 Pa·s, more preferably from 1 to 20 Pa·s. When the viscosity is at least 0.05 Pa·s, the proportion of the after-mentioned monomer (B') can be suppressed, and it is possible to prevent deterioration of the physical properties of the resin layer. Further, a low boiling point component becomes less, such being suitable for the after-described reduced-pressure lamination method. When the viscosity is at most 50 Pa·s, air bubbles are less likely to remain in the resin layer.

The viscosity of the curable resin composition for forming a resin layer is measured by means of an E type viscometer at 25° C.

From such a viewpoint that the viscosity can easily be adjusted to the above range, the curable resin composition for forming a resin layer preferably comprises at least one oligomer (A') having a curable group and a number average molecular weight of from 1,000 to 100,000, at least one monomer (B') having a curable group and a molecular weight of from 125 to 600, wherein the proportion of the monomer (B') is from 40 to 80 mass %, based on the total (100 mass %) of the oligomer (A') and the monomer (B').

The number average molecular weight of the oligomer (A') is preferably from 1,000 to 100,000, more preferably from 10,000 to 70,000. When the number average molecular weight of the oligomer (A') is within such a range, the viscosity of the curable resin composition for forming a resin layer can easily be adjusted to the above range.

The number average molecular weight of the oligomer (A') is a number average molecular weight calculated as polystyrene, obtained by GPC measurement. Here, in a case where in the GPC measurement, a peak attributable to an unreacted low molecular weight component (such as a monomer) appears, the number average molecular weight is obtained by excluding such a peak.

As the curable group of the oligomer (A'), in the case of a photocurable group, an addition-polymerizable unsaturated group (such as an acryloyloxy group or a methacryloyloxy group), or a combination of an unsaturated group and a thiol group, may, for example, be mentioned, and in the case of a thermosetting group, an epoxy group may, for example, be mentioned. From such a viewpoint that the curing rate is high and a highly transparent resin layer can be obtained, at least one type of group selected from the group consisting of an acryloyloxy group and a methacryloyloxy group is preferred. Further, the curable group in a relatively high molecular weight oligomer (A') tends to have a lower reactivity than the curable group in a relatively low molecular weight monomer (B'), curing of the monomer (B') tends to proceed first, whereby the viscosity of the entire composition is likely to be abruptly increased, and the curing reaction tends to be non-uniform. In order to obtain a uniform resin layer, it is more preferred that the curable resin of the oligomer (A') is made to be an acryloyloxy group having a relatively high reactivity, and the curable group of the monomer (B') is made to be a methacryloyloxy group having a relatively low reactivity.

As the oligomer (A'), one having an average of from 1.8 to 4 curable groups per molecule is preferred from the viewpoint of the curability of the curable resin composition for forming a resin layer and the mechanical properties of the resin layer.

As the oligomer (A'), an urethane oligomer having an urethane bond, a poly(meth)acrylate of a polyoxyalkylene polyol, or a poly(meth)acrylate of a polyester polyol may, for example, be mentioned, and from such a viewpoint that by e.g. designing urethane chain molecules, it is possible to widely adjust the mechanical properties of the resin after curing, the adhesion with the plates, etc., an urethane oligomer is preferred.

The proportion of the oligomer (A') is preferably from 20 to 60 mass %, more preferably from 30 to 50 mass %, based on the total (100 mass %) of the oligomer (A') and the monomer (B'). When the proportion of the oligomer (A') is at least 20 mass %, the thermal resistance of the resin layer becomes good. When the proportion of the oligomer (A') is at most 60 mass %, the curability of the curable resin composition for forming a resin layer and the adhesion between the plates and the resin layer becomes good.

The molecular weight of the monomer (B') is preferably from 125 to 600, more preferably from 140 to 400. When the molecular weight of the monomer (B') is at least 125, it is possible to prevent evaporation of the monomer at the time of producing a laminate by the after-described reduced-pressure lamination method. When the molecular weight of the monomer (B') is at most 600, the adhesion between the plates and the resin layer becomes good.

As the curable group of the monomer (B'), in the case of a photocurable group, an addition-polymerizable unsaturated group (such as an acryloyloxy group or a methacryloyloxy group), or a combination of an unsaturated group and a thiol group may, for example, be mentioned, and in the case of a thermosetting group, an epoxy group may, for example, be mentioned. From such a viewpoint that the curing rate is high and a highly transparent resin layer can be obtained, a group selected from an acryloyloxy group and a methacryloyloxy group is preferred. Further, the curable group in the relatively low molecular weight monomer (B') tends to have a higher reactivity than the curable group in the relatively high molecular weight oligomer (A'), whereby curing of the monomer (B') is likely to proceed first, so that the viscosity of the entire composition is likely to be abruptly increased, and the curing reaction tends to be non-uniform. In order to obtain a uniform resin layer, it is more preferred that the curable group of the monomer (B') is made to be a methacryloyloxy group having a relatively low reactivity, and the curable group of the oligomer (A') is made to be an acryloyloxy group having a relatively high reactivity.

As the monomer (B'), one having from 1 to 3 curable groups per molecule is preferred from the viewpoint of the curability of the curable resin composition for forming a resin layer and the mechanical properties of the resin layer.

The monomer (B') preferably contains a monomer (B3) having a hydroxy group from the viewpoint of the adhesion between the plates and the resin layer. As the monomer (B3) having a hydroxy group, the same one as the monomer (B3) in the curable resin composition for forming a seal part may be mentioned, and 2-hydroxybutyl methacrylate is particularly preferred.

The proportion of the monomer (B3) is preferably from 15 to 70 mass %, more preferably from 20 to 50 mass %, based on the total (100 mass %) of the oligomer (A') and the monomer (B'). When the proportion of the monomer (B3) is at least 15 mass %, the curability of the curable resin composition for forming a resin layer and the adhesion between the plates and the resin layer will be good.

The monomer (B') preferably contains the following monomer (B4) from the viewpoint of the mechanical properties of the resin layer.

Monomer (B4): An alkyl methacrylate having a $C_{8-22}$ alkyl group.

As the monomer (B4), n-dodecyl methacrylate, n-octadecyl methacrylate or n-behenyl methacrylate may, for example, be mentioned, and n-dodecyl methacrylate or n-octadecyl methacrylate is preferred.

The proportion of the monomer (B4) is preferably from 5 to 50 mass %, more preferably from 15 to 40 mass %, based on the total (100 mass %) of the oligomer (A') and the monomer (B'). When the proportion of the monomer (B4) is at least 5 mass %, the flexibility of the resin layer will be good.

The curable resin composition for forming a resin layer may be a photocurable resin composition, or a thermosetting resin composition. As the curable resin composition for forming a resin layer, a photocurable resin composition containing a photopolymerization initiator (C) is preferred, since curing is thereby carried out at a low temperature, and the curing rate is high.

As the photopolymerization initiator (C), the same one as the photopolymerization initiator (C) in the curable resin composition for forming a seal part may be mentioned.

The amount of the photocurable initiator (C) is preferably from 0.01 to 10 parts by mass, more preferably from 0.1 to 2.5 parts by mass, per 100 parts by mass of the total of the oligomer (A') and the monomer (B').

The curable resin composition for forming a resin layer may contain various additives such as a polymerization inhibitor, a photocuring accelerator, a chain transfer agent, a photostabilizer (such an ultraviolet absorber or a radical-capturing agent), an antioxidant, a flame retardant, an adhesive improving agent (such as a silane coupling agent), a pigment, a dye, etc., as the case requires, and it preferably contains a polymerization inhibitor and a photostabilizer. Particularly, by containing a polymerization inhibitor in an amount smaller than the polymerization initiator, it is possible to improve the stability of the curable resin composition for forming a resin layer and to adjust the molecular weight of the resin layer after curing.

(Step (c))

After the step (b), the first plate having the curable resin composition for forming a resin layer supplied, is carried into a reduced-pressure apparatus, and the first plate is placed horizontally on a fixed support table in the reduced-pressure apparatus so that the surface of the curable resin composition faces upward.

At an upper portion in the reduced-pressure apparatus, a vertically movable support mechanism is provided, and the second plate is attached to the movable support mechanism.

In a case where a thin-film type solar cell device is formed on the surface of the second plate, the surface on the side where the thin-film type solar cell device is formed is permitted to face downward, or in a case where the second plate is a display device, the surface on the side where an image is to be displayed is permitted to face downward. In a case where an antireflection layer is formed on the surface of the second plate, the surface on the side where no antireflection layer is formed is permitted to face downward.

The second plate is located above the first plate and at a position not in contact with the curable resin composition for forming a resin layer. That is, the curable resin composition for forming a resin layer on the first plate and the second plate (the thin-film type solar cell device in a case where the thin-film type solar cell device is formed thereon) are permitted to face each other without being in contact with each other.

Otherwise, a vertically movable support mechanism may be provided at a lower portion in the reduced-pressure apparatus, and the first plate having the curable resin composition supplied, may be placed on the movable support mechanism. In such a case, the second plate is attached to a fixed support table provided at an upper portion in the reduced-pressure apparatus, and the first and second plates are permitted to face each other.

Further, both the first and second plates may be supported by movable support mechanisms provided one above the other in the reduced-pressure apparatus.

After positioning the first and second plates at prescribed positions, the inside of the reduced-pressure apparatus is depressurized to a prescribed reduced-pressure atmosphere. If possible, during the depressurizing operation or after depressurizing to the reduced-pressure atmosphere, the first and second plates may be positioned at the prescribed positions in the reduced-pressure apparatus.

After the inside of the reduced-pressure apparatus becomes a reduced-pressure atmosphere, the second plate supported by the mobile support mechanism is moved downward to laminate the second plate on the curable resin composition for forming a resin layer on the first plate.

By such laminating, the curable resin composition for forming a resin layer is sealed in a space surrounded by the surface of the first plate (in a case where a thin-film type solar cell device is formed on the first plate, the surface of the thin-film type solar cell device, or in the case of a display device, the surface of the first plate on the side where an image is to be displayed), the surface of the second plate (in a case where a thin-film type solar cell device is formed on the second plate, the surface of the thin-film type solar cell device, or in the case of a display device, the surface of the second plate on the side where an image is to be displayed) and the uncured seal part.

At the time of such laminating, the curable resin composition for forming a resin layer is spread by the own weight of the second plate, the pressing pressure from the movable support mechanism, etc., so that the curable resin composition for forming a resin layer is filled in the above-mentioned space, and thereafter, at the time of exposing it to the high pressure atmosphere in step (d), a layer of the curable resin composition for forming a resin layer with little or no air bubbles will be formed. Hereinafter, the laminated member will be referred to also as "a laminate precursor".

At the time of the laminating, the reduced-pressure atmosphere is not more than 100 Pa and preferably at least 10 Pa. If the pressure of the reduced-pressure atmosphere is too low, such a reduced-pressure atmosphere may adversely affect the respective components (such as a curable compound, a photopolymerization initiator, a polymerization inhibitor, a photostabilizer, etc.) contained in the curable resin composition for forming a resin layer. For example, if the pressure of the reduced-pressure atmosphere is too low, the respective components are likely to vaporize, or it may take time to provide such a reduced-pressure atmosphere. The pressure of the reduced-pressure atmosphere is more preferably from 15 to 40 Pa.

The period of time from the time when the first and second plates are laminated to the release of the reduced-pressure atmosphere is not particularly limited, and the reduced-pressure atmosphere may be released immediately after sealing of the curable resin composition for forming a resin layer, or after sealing of the curable resin composition for forming a resin layer, the reduced-pressure state may be maintained for a prescribed time. By maintaining the reduced-pressure state for a prescribed time, the curable resin composition for forming a resin layer tends to flow in the sealed space, and the distance between the first and the second plates becomes uniform, whereby even if the atmosphere pressure is increased, the sealed state may easily be maintained. The period of time for maintaining the reduced-pressure state may be a long time of at least a few hours, but from the viewpoint of the production efficiency, it is preferably within 1 hour, more preferably within 10 minutes.

In the process of the present invention, an uncured seal part is formed by applying the curable resin composition for forming a seal part of the present invention, whereby the thickness of the curable resin composition for forming a resin layer in the laminate precursor obtained in step (c) can be made relatively thick at a level of from 10 µm to 3 mm.

(Step (d))

After releasing the reduced-pressure atmosphere in step (c), the laminate precursor is placed in a pressure atmosphere wherein the pressure of the atmosphere is at least 50 kPa.

When the laminate precursor is placed in a pressure atmosphere of at least 50 kPa, the first and second plates are pressed by the increased pressure in a direction to closely adhere to each other, whereby if air bubbles are present in the sealed space in the laminate precursor, the curable resin composition for forming a resin layer tends to flow into the air bubbles, and the entire sealed space will be uniformly filled by the curable resin composition for forming a resin layer.

The pressure atmosphere is usually from 80 kPa to 120 kPa. The pressure atmosphere may be an atmospheric pressure atmosphere or may be a pressure higher than the atmospheric pressure atmosphere. The atmospheric air atmosphere is most preferred from such a viewpoint that the operation of e.g. curing the curable resin composition for forming a resin layer can be carried out without requiring any special installation.

The period of time (hereinafter referred to as the high pressure retention time) from the time when the laminate precursor is placed in a pressure atmosphere of at least 50 kPa to the initiation of the curing of the curable resin composition for forming a resin layer is not particularly limited. In a case where a process of taking out the laminate precursor from the reduced-pressure apparatus and transferring it to a curing apparatus, and then initiating the curing, is carried out in an atmospheric pressure atmosphere, the time required for such a process is the high pressure retention time. Accordingly, in a case where at the time when the laminate precursor is placed in the atmospheric air atmosphere, air bubbles are already not present in the sealed space of the laminate precursor, or air bubbles have disappeared during the process, the curable resin composition for forming a resin layer can be immediately cured. In a case where it takes time until air bubbles disappear, the laminated precursor is held in the atmosphere under a pressure of at least 50 kPa until the air bubbles disappear. Further, usually, there will be no trouble even if the high pressure retention becomes long, and therefore, the high pressure retention time may be prolonged from other necessity of the process. The high pressure retention time may be as long as more than one day, but from the viewpoint of the production efficiency, it is preferably within 6 hours, more preferably within 1 hour, and from the viewpoint of high production efficiency, it is particularly preferably within 10 minutes.

Then, by curing the curable resin composition for forming a resin layer, a resin layer as a sealing material for a solar cell module or a resin layer to bond a protective plate and a display device of a display unit is formed, and a laminate is produced. At that time, an uncured seal part formed from the curable resin composition for forming a seal part may be cured at the same time as the curing of the curable resin composition for forming a resin layer, or may be preliminarily cured before the curing of the curable resin composition for forming a resin layer.

In a case where the curable resin composition for forming a resin layer and the curable resin composition for forming sealing part are photocurable resin compositions, the photocurable resin compositions in the laminate precursor are irradiated with light for curing. For example, by applying ultraviolet rays or visible light with a short wavelength from a light source (such as an ultraviolet lamp or a high pressure mercury lamp), the photocurable resin compositions are cured.

The light is applied from the side having optical transparency between the first plate (including a thin-film type solar cell device, in a case where the thin-film type solar cell device is formed) and the second plate (including a thin-film type solar cell device, in a case where the thin-film type solar cell device is formed). When both materials have optical transparency, the light may be applied from both sides.

In the case of a display unit, it is possible to obtain light transmittance by operating a transmission type display device, but in a non-operated state, no light transmittance is obtainable in many cases, and therefore, light for curing is applied from a transparent plate serving as a protective plate. In the case of using a transmission-light/scattering type display device exhibiting a transparent state even during no operation, it is also possible to utilize light from the display device side.

The light is preferably ultraviolet rays or visible light with a wavelength of at most 450 nm. Particularly in a case where an antireflection layer is formed on a transparent plate, and the antireflection layer or the transparent resin film having the antireflection layer formed thereon does not permeate ultraviolet rays, curing by visible light becomes necessary.

In a case where a print-shielding portion is formed along the peripheral portion of a transparent plate, and an uncured seal part or the curable resin composition for forming a resin layer is present at a region interposed by the print-shielding portion and a display device, sufficient curing may not be carried out only by light from an opening other than the print-shielding portion of the transparent plate. In such a case, it is preferred to apply ultraviolet rays or visible light with a wavelength of at most 450 nm from the lateral side surface of the display device to cure the uncured seal part and the curable resin composition for forming a resin layer. As a light source for irradiation from the side surface, a light source to be used for irradiation from the transparent plate side may be used, but it is preferred to use LED emitting ultraviolet rays or visible light with a wavelength of at most 450 nm from the viewpoint of the space for installation of the light source. As the light irradiation step, irradiation from the side surface of the display device may be carried out after irradiation from a transparent plate, or the light irradiation may be carried out in a reversed order or at the same time. However, in order to further accelerate the photocuring of the curable resin composition for forming a resin layer or the uncured seal part in the print-shielding portion, it is preferred to carry out light irradiation from the side surface fast, or to carry out light irradiation from the transparent plate side simultaneously from the side surface.

In the above step (d), in the reduced-pressure apparatus wherein the step (c) has been carried out, the reduced-pressure in the reduced-pressure chamber of the reduced-pressure apparatus is released, and the reduced-pressure chamber is adjusted to a pressure of from 80 kPa to 120 kPa, e.g. to the atmospheric pressure, so that the curable resin composition for forming a resin layer and the uncured seal part of the laminate precursor are cured in such a pressure atmosphere, or the laminate precursor is transferred from the reduced-pressure apparatus wherein the step (c) has been carried out to a separate curing treatment apparatus, and the inside of such a curing treatment apparatus is adjusted to a pressure of from 80 kPa to 120 kPa, so that the curable resin composition for forming a resin layer and the uncured seal part of the laminate precursor are cured in such a pressure atmosphere.

[Specific Examples]

In the process of the present invention, it is optional to use the back plate or the front plate as the first plate. Accordingly, the display unit in the second embodiment and the solar cell modules (as illustrated) in the third to fifth embodiments can be produced, respectively, by the following two methods, depending upon the selection of the first plate.

With respect to the second embodiment:

(β-1) A method of using, as the first plate, a display device (the back plate) and using, as the second plate, a transparent plate 10 (the front plate) which becomes a protective plate.

(β-2) A method of using, as the first plate, a transparent plate 10 (the front plate) which becomes a protective plate and using, as the second plate, a display device (the back plate).

With respect to the third embodiment:

(γ-1) A method of using, as the first plate, a transparent plate 10 (the back plate) and using, as the second plate, a glass substrate 16 (the front plate).

(γ-2) A method of using, as the first plate, a glass substrate 16 (the front plate) and using, as the second plate, a transparent plate 10 (the back plate).

With respect to the fourth embodiment:

(δ-1) A method of using, as the first plate, a glass substrate 16 (the back plate) and using, as the second plate, a transparent plate 10 (the front plate).

(δ-2) A method of using, as the first plate, a transparent plate 10 (the front plate) and using, as the second plate, a glass substrate 16 (the back plate).

With respect to the fifth embodiment:

(ε-1) A method of using, as the first plate, a glass substrate 16 (the back plate) and using, as the second plate, a glass substrate 16 (the front plate).

(ε-2) A method of using, as the first plate, a glass substrate 16 (the front plate) and using, as the second plate, a glass substrate 16 (the back plate).

Now, taking the case of the method (β-1) as an example, the process for producing a laminate of the second embodiment to be used as a display unit will be described in detail with reference to the drawings.

(Step (a))

Figure 6:
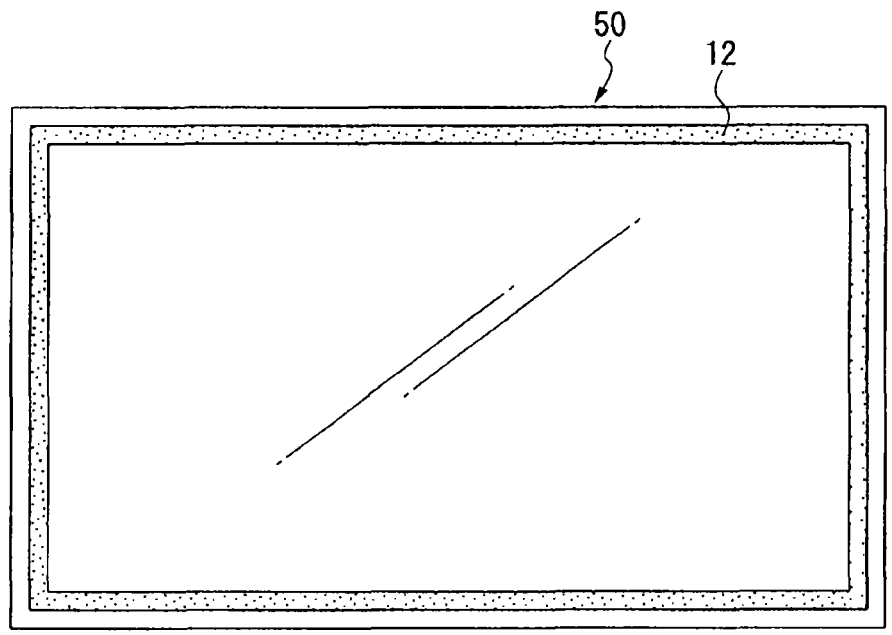
FIG. 6 is a plan view illustrating an example of the state of step (a) in the process for producing a laminate of the present invention.
Figure 7:
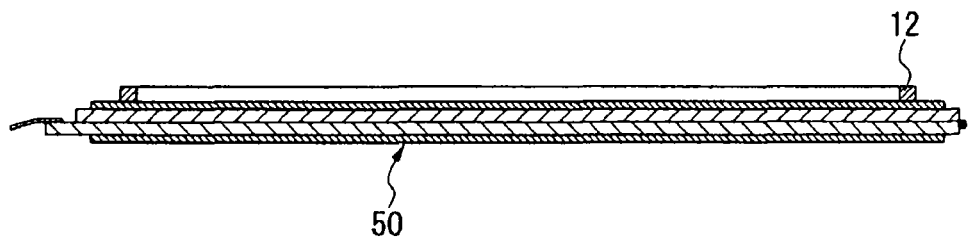
FIG. 7 is a cross-sectional view illustrating an example of the state of step (a) in the process for producing a laminate of the present invention.

As shown in FIGS. 6 and 7, a photocurable resin composition for forming a seal part of the present invention is applied along the edge of a display device 50 (the first plate) by e.g. a dispenser (not shown) to form an uncured seal part 12.

At the peripheral portion of the display device, a wiring component such as FPC to conduct electrical signals to operate the display device may be installed. With a view to facilitating installation of the wiring component at the time of holding the respective plates in the process of the present invention, it is preferred that the display device is disposed on the lower side as the first plate.

(Step (b))

Figure 8:
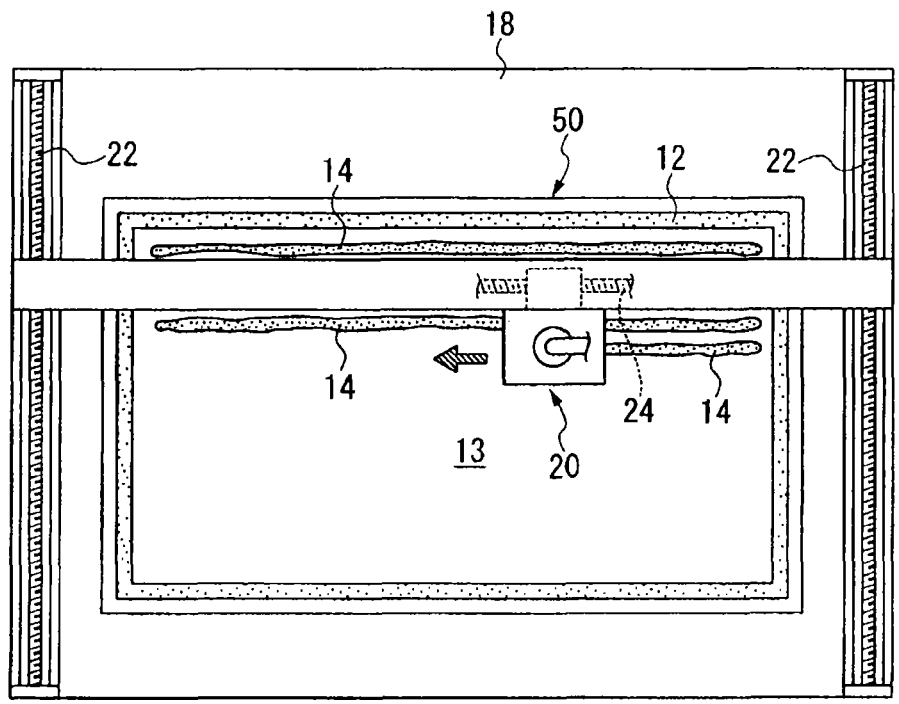
FIG. 8 is a plan view illustrating an example of the state of step (b) in the process for producing a laminate of the present invention.
Figure 9:
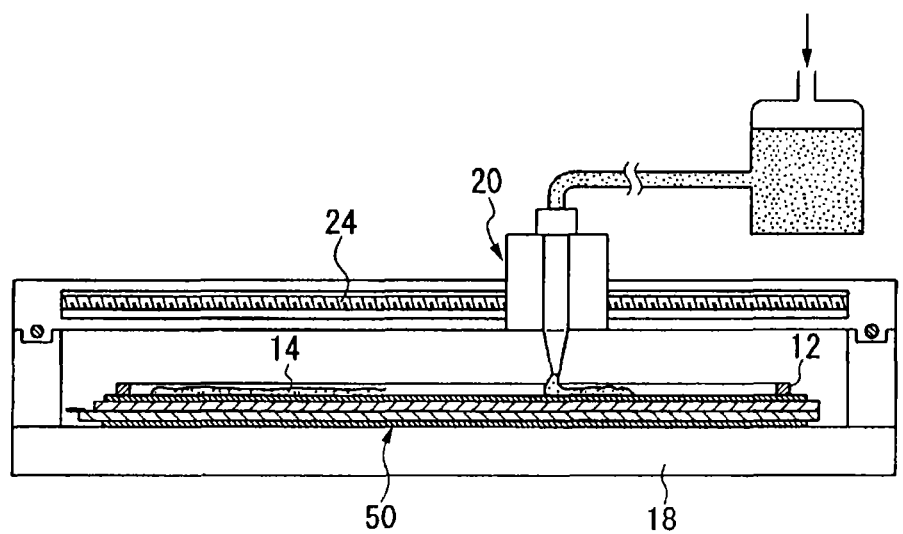
FIG. 9 is a cross-sectional illustrating an example of the state of step (b) in the process for producing a laminate of the present invention.

Then, as shown in FIGS. 8 and 9, a photocurable resin composition 14 for forming a resin layer is supplied to a rectangular region 13 enclosed by the uncured seal part 12 of the display device 50. The amount of the photocurable resin composition 14 for forming a resin layer to be supplied is preliminarily set to be such an amount that the space sealed by the uncured seal part 12, the display device 50 and the transparent plate 10 (see FIG. 9) is filled with the photocurable resin composition 14 for forming a resin layer.

As shown in FIGS. 8 and 9, the supplying of the photocurable resin composition 14 for forming a resin layer is carried out by placing the display device 50 flatly on a lower press platen 18 and supplying the photocurable resin composition 14 for forming a resin layer in a line shape-, in a strip shape- or in a rod-shape by a dispenser 20 which moves in a horizontal direction.

The dispenser 20 is made to be horizontally movable over the entire range of the region 13 by a known horizontal movement mechanism comprising a pair of feed screws 22 and a feed screw 24 perpendicular to the feed screws 22. Here, instead of the dispenser 20, a die coater may be employed.

(Step (c))

Figure 10:
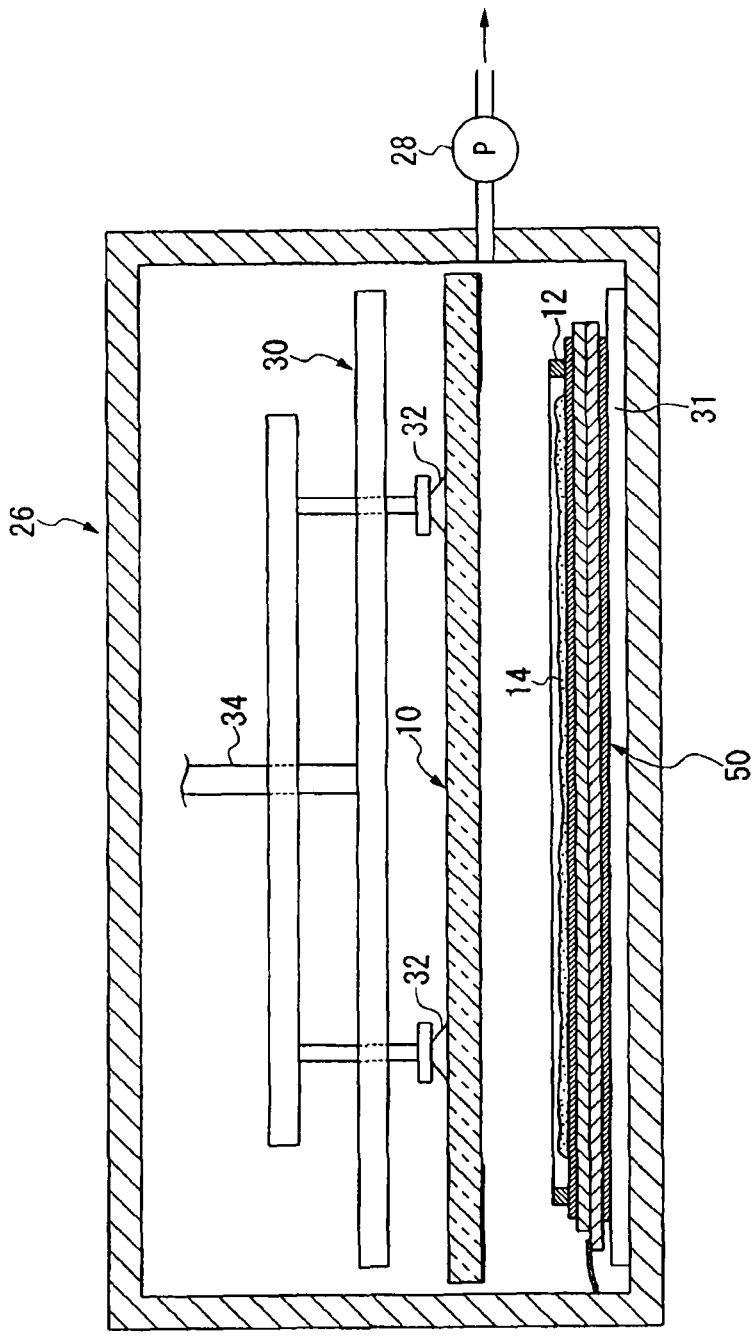
FIG. 10 is a cross-sectional view illustrating an example of the state of step (c) in the process for producing a laminate of the present invention.

Then, as shown in FIG. 10, the display device 50 (the first plate) and the transparent plate 10 (the second plate) are carried into a reduced-pressure apparatus 26. At an upper portion in the reduced-pressure apparatus 26, an upper platen 30 having a plurality of adsorption pads 32 is disposed, and at a lower portion, a lower platen 31 is provided. The upper platen 30 is made to be movable in a vertical direction by an air cylinder 34.

The transparent plate 10 is attached to the adsorption pads 32. The display device 50 is fixed on the lower platen 31 so as for the side having the photocurable resin composition 14 for forming a resin layer supplied facing upward.

Then, the air in the reduced-pressure apparatus 26 is suctioned by a vacuum pump 28. After the atmospheric pressure in the reduced-pressure apparatus 26 reaches a reduced-pressure atmosphere of e.g. from 15 to 40 Pa, the transparent plate 10 is lowered in a state adsorbed and held by the adsorption pads 32 of the upper platen 30, towards the display device 50 waiting below, by operating the air cylinder 34. And, the display device 50 and the transparent plate 10 are laminated via the uncured seal part 12 to form a laminate precursor, and the laminate precursor is held in a reduced-pressure atmosphere for a prescribed period of time.

Here, the attached position of the display device 50 to the lower platen 31, the number of adsorption pads 32, the attached position of the transparent plate 10 to the upper platen 30, etc. are suitably adjusted depending upon the sizes, shapes, etc. of the display device 50 and the transparent plate 10.

(Step (d))

Then, the inside of the reduced-pressure apparatus 26 is made to be e.g. atmospheric pressure, whereupon the laminate precursor is taken out from the reduced-pressure apparatus 26. When the laminated precursor is placed in the atmospheric pressure atmosphere, the surface of the display device 50 side and the surface of the transparent plate 10 side of the laminated precursor are pressed by the atmospheric pressure, and the photocurable resin composition 14 for forming a resin layer in the sealed space is pressed by the display device 50 and the transparent plate 10. By this pressure, the photocurable resin composition 14 for forming a resin layer in the sealed space will flow, and the entire sealed space will be uniformly filled with the photocurable resin composition 14 for forming a resin layer. Thereafter, ultraviolet rays are applied from the side surface of the laminate precursor and from the transparent plate 10 side, to cure the uncured seal part 12 and the photocurable resin composition 14 for forming a resin layer in the inside of the laminate precursor thereby to obtain a display unit 2.

In the foregoing, the process of producing a laminate of the present invention has been described in detail by taking the case of the method (β-1) as an example. However, also in the case of other methods (β-2, γ-1, γ-2, δ-1, δ-2, ε-1 and ε-2) as well as in the case of the transparent laminate (a) in the first embodiment, laminates can be produced in the same manner.
(Advantageous Effects)

In the above-described process for producing a laminate of the present invention, an uncured seal part is formed by applying the curable resin composition for forming a seal part of the present invention, whereby the height of the uncured seal part is sufficiently maintained. Therefore, the thickness of the curable resin composition for forming a resin layer interposed between the first and second plates can be made thick. Specifically, such a thickness can be made to be from 10 μm to 3 mm. Further, since the uncured seal part is formed by applying the curable resin composition for forming a seal part of the present invention, the uncured seal part is continuous without a space. Therefore, a defect such as leakage, during the production, of the curable resin composition for forming a resin layer as a raw material for the resin layer is less likely to result.

Further, by the process of the present invention, it is possible to produce a display unit and a solar cell module having a relatively large area without forming air bubbles in the resin layer. Even if air bubbles remain in the curable resin composition for forming a resin layer sealed under a reduced-pressure, in a high pressure atmosphere prior to curing, the pressure is applied also to the sealed curable resin composition for forming a resin layer, whereby the volume of the air bubbles decreases, and air bubbles readily disappear. For example, the volume of a gas in the air bubbles in the curable resin composition for forming a resin layer sealed under 100 Pa is considered to be 1/1,000 under 100 kPa. The gas may be dissolved in the curable resin composition for forming a resin layer, whereby the gas in air bubbles of a very small volume will be readily dissolved in the curable resin composition for forming a resin layer and disappear.

Further, even if a pressure such as the atmospheric pressure is applied to the curable resin composition for forming a resin layer after sealing, since the liquid curable resin composition for forming a resin layer is a flowable composition, such a pressure is uniformly distributed over the surface of a thin-film type solar cell device, whereby no excessive stress is applied to a part of the surface of the thin-film type solar cell device in contact with the curable resin composition for forming a resin layer, and a damage to the thin-film type solar cell device or the display device is less likely to occur. Further, in a case where the curable resin composition for forming a resin layer is a photocurable composition, a high temperature is not required for the curing, and therefore, there will be no substantial possibility of a damage of the thin-film type solar cell device or the display device by a high temperature.

Further, the interface bonding strength between the resin layer formed by curing of the curable resin composition for forming a resin layer and the thin-film type solar cell device or the plate, or the display device or the transparent plate, is higher than the interface bonding strength by fusion of a thermal fusion resin. Besides, the flowable curable resin composition for forming a resin layer is pressed to adhere to the surface of the thin-film type solar cell device or the plate, or the surface of the display device for the transparent plate, and cured in such a state, whereby a higher interface bonding strength can be obtained, and at the same time, uniform bonding to the surface of the thin-film type solar cell device for the plate, or the surface of the display device or the transparent plate, can be obtained, thus minimizing the possibility of partial lowering of the interface bonding strength. Therefore, there is little possibility of peeling at the surface of the resin layer, and there is little possibility of inclusion of moisture or corrosive gas from a portion where the interface bonding strength is inadequate.

Furthermore, as compared with a method (injection method) of injecting a flowable curable resin composition for forming a resin layer to a space having a wide area and a narrow distance between a pair of plates, it is possible to fill the curable resin composition for forming a resin layer in a short period of time without no substantial formation of air bubbles. Besides, it is possible to easily fill a high viscosity curable resin composition for forming a resin layer with little restriction with respect to the viscosity of the curable resin composition for forming a resin layer. Therefore, it is possible to employ a curable resin composition for forming a resin layer with a high viscosity containing a relatively high molecular weight curable compound, whereby the strength of the resin layer can be improved.

EXAMPLES

Now, Examples will be described which were carried out to confirm the effectiveness of the present invention. Example 1 is a Working Example of the present invention, and Examples 2 and 3 are Comparative Examples.
(Number Average Molecular Weight)

The number average molecular weight of an oligomer was obtained by means of GPC apparatus (HLC-8020, manufactured by TOSOH CORPORATION)
(Viscosity)

The viscosity of a photocurable resin composition was measured by means of E type viscometer (RE-85U, manufactured by Toki Sangyo Co., Ltd.)
(Gel Percentage)

As an index for the cured degree of a cured product, a gel percentage was obtained by the following method.

0.4 g of a cured product was sampled and immersed in 100 mL of toluene at 25° C. for 24 hours, whereupon toluene was filtered, and the remaining solid content was dried at 100° C. for one hour, and the dried mass was measured, and the gel percentage was calculated by the following formula.

Gel percentage (%)=Dried mass (g) after immersion/ 0.4 (g)×100

(Haze Value)

The haze value was obtained by a measurement in accordance with ASTMD1003 by means of Haze Guard II, manufactured by Toyo Seiki Seisaku-Sho, Ltd.

Example 1

(Display Device)

A liquid crystal display device was taken out from a commercially available 32 type liquid crystal TV receiver (HDV-32WX2D-V, manufactured by PC DEPOT Corporation). The liquid crystal display device had a length of 712 mm, a width of 412 mm and a thickness of about 2 mm. Polarizing plates were bonded to both surfaces of the liquid crystal display device, and six FPC for driving were bonded to one of the long sizes, and a printed circuit board was bonded to a terminal of FPC. The image display region had a length of 696 mm and a width of 390 mm. This liquid crystal display device is designated as display device A.
(Glass Plate)
Along the edge of one surface of soda lime glass having a length of 794 mm, a width of 479 mm and a thickness of 3 mm, a print-shielding portion was formed in a picture frame-form by a ceramic printing containing a black pigment so that the opening had a length of 698 mm and a width of 392 mm. Then, an antireflection film (ReaLook X4001, manufactured by NOF CORPORATION) was bonded on the entire surface on the rear side of the print-shielding portion, via a protective film, to prepare a glass plate B to be a protective plate.
(Photocurable Resin Composition for Forming Seal Part)
A bifunctional polypropylene glycol having its molecular terminals modified with ethylene oxide (number average molecular weight calculated from the hydroxy value: 4,000) and hexamethylene diisocyanate were mixed in a molar ratio of 6:7 and then diluted with isobornyl acrylate (IBXA, manufactured by Osaka Organic Chemical Industry Ltd.), followed by a reaction at 70° C. in the presence of a tin catalyst to obtain a prepolymer, to which 2-hydroxyethyl acrylate was added in a molar ratio of substantially 1:2, followed by a reaction at 70° C. to obtain an urethane acrylate oligomer (hereinafter oligomer (A) which will be referred to as UC-1) solution diluted with 30 mass % of isobornyl acrylate. The number of curable groups in UC-1 was 2, and the number average molecular weight was about 55,000. The viscosity at 60° C. of the UC-1 solution was about 580 Pa·s.
90 parts by mass of the UC-1 solution and 10 parts by mass of 2-hydroxybutyl methacrylate (light ester HOB, manufactured by Kyoeisha Chemical Co., Ltd.) were uniformly mixed to obtain a mixture (proportion of monomer (B) having a molecular weight of from 125 to 600 in the mixture thus prepared: 37 mass %). 100 parts by mass of this mixture, 1 part by mass of 1-hydroxy-cyclohexyl-phenyl-ketone (photopolymerization initiator, IRGACURE 184, manufactured by Ciba Specialty Chemicals), 0.1 part by mass of bis(2,4,6-trimethylbenzoyl)-phenylphosphine oxide (photopolymerization initiator, IRGACURE 819, manufactured by Ciba Specialty Chemicals), 0.04 part by mass of 2,5-di-t-butylhydroquinone (polymerization inhibitor), and 0.3 part by mass of an ultraviolet absorber (TINUVIN 109, manufactured by Ciba Specialty Chemicals) were uniformly mixed to obtain a photocurable resin composition C for forming a seal part.
The photocurable resin composition C for forming a seal part was, as put in a container, set in a reduced-pressure apparatus in an open state, and the inside of the reduced-pressure apparatus was depressurized to about 20 Pa and held for 10 minutes to carry out defoaming treatment. The viscosity at 25° C. of the photocurable resin composition for forming a seal part was measured and found to be about 1,400 Pa·s.
Then, the photocurable resin composition C for forming a seal part was interposed between a pair of soda lime glass (100×100 mm, thickness: 2 mm) so that the thickness would be about 1 mm and irradiated with ultraviolet rays of 365 nm with light intensity of 2 mW/cm$^2$ from a chemical lamp, to obtain a cured product. The gel percentage of the cured product was obtained and found to be 91%, and thus, the curability was good.
(Photocurable Resin Composition for Forming a Resin Layer)
A bifunctional polypropylene glycol having its molecular terminals modified with ethylene oxide (number average molecular weight calculated from the hydroxy value: 4,000) and isophorone diisocyanate were mixed in a molar ratio of 4:5, followed by a reaction at 70° C. in the presence of a catalyst of a tin compound to obtain a prepolymer, to which 2-hydroxyethyl acrylate was added in a molar ratio of substantially 1:2, followed by a reaction at 70° C. to obtain an urethane acrylate oligomer (hereinafter referred to as UA-2). The number of curable groups in UA-2 was 2, and the number average molecular weight was about 24,000, and the viscosity at 25° C. was about 830 Pa·s.
40 parts by mass of UA-2, 24 parts by mass of 2-hydroxybutyl methacrylate (light ester HOB, manufactured by Kyoeisha Chemical Co., Ltd.) and 36 parts by mass of n-dodecyl methacrylate, were uniformly mixed, and to 100 parts by mass of such a mixture, 0.2 part by mass of bis(2,4,6-trimethylbenzoyl)-phenylphosphine oxide (photopolymerization initiator, IRGACURE 819, manufactured by Ciba Specialty Chemicals), 0.04 part by mass of 2,5-di-t-butylhydroquinone (polymerization inhibitor), 1 part by mass of 1,4-bis(3-mercaptobutyryloxy)butane (chain train transfer agent, Karenz MT BD-1, manufactured by Showa Denko K.K.) and 0.3 part by mass of an ultraviolet absorber (TINUVIN 109, manufactured by Ciba Specialty Chemicals) were uniformly dissolved to obtain a photocurable resin composition D for forming a resin layer.
The photocurable resin composition D for forming a resin layer was, as put in a container, set in a reduced-pressure apparatus in an open state, and the inside of the reduced-pressure apparatus was depressurized to about 20 Pa and held for 10 minutes to carry out defoaming treatment. The viscosity at 25° C. of the photocurable resin composition D for forming a resin layer was measured and found to be 1.7 Pa·s.
(Step (a))
Along the entire periphery at a position of about 5 mm outside of an image display region of the display device A as the second plate, the photocurable resin composition C for forming a seal part was applied by a dispenser so that the width became about 1 mm and the applied thickness became about 0.6 mm to form an uncured seal part.
(Step (b))
In a region inside of the uncured seal part applied along the outer periphery of the image display region of the display device A, the photocurable resin composition D for forming a resin layer was supplied at a plurality of positions by means of a dispenser so that the total mass would be 125 g.
During the supply of the photocurable resin composition D for forming a resin layer, the shape of the uncured seal part was maintained.
(Step (c))
The display device A was placed horizontally on the upper surface of a lower platen in a reduced-pressure apparatus wherein a lifting and lowering apparatus comprising a pair of platens was set, so that the surface of the photocurable resin composition D for forming a resin layer faced upward. A glass plate B as the first plate was held on the lower surface of an upper platen of the lifting and lowering apparatus in a reduced-pressure apparatus by means of an electrostatic chuck so that the surface on the side where the print-shielding portion was formed, faced the display device A. The holding position was adjusted so that, as viewed from above, the opening free from the print-shielding portion of the glass plate B and the image display region of the display device A became the same position with a margin of about 1 mm, and in the vertical direction, the distance from the display device A would be 30 mm.
The reduced-pressure apparatus was made in a sealed state and evacuated until the pressure in the reduce pressure apparatus became about 15 Pa. By the lifting and lowering apparatus in the reduced-pressure apparatus, the upper and lower platens were brought to be closer to each other so that the display device A and the glass plate B were pressed under a pressure of 2 kPa via the photocurable resin composition D for forming a resin layer and held for one minute. The electrostatic chuck was deactivated, and from the upper platen, the glass plate H was released, and the inside of the reduced-pressure apparatus was returned to the atmospheric pressure in about 15 seconds to obtain a laminate precursor E having the photocurable resin composition D for forming a resin layer sealed by the display device A, the glass plate B and the uncured seal part.

In the laminate precursor E, the shape of the uncured seal part was maintained substantially in the initial state.

(Step (d))

To the uncured seal part (the photocurable resin composition C for forming a seal part) formed along the edge of the display device A of the laminate precursor E, light was applied along the entire periphery of the uncured seal part for about 10 minutes from the side of the display device A by means of an ultraviolet light source having ultraviolet LED with the main emission wavelength of about 390 nm disposed in a line-form, to cure the seal part, and the laminate precursor E was held horizontally to stand still for about 10 minutes.

By uniformly applying ultraviolet rays from a chemical lamp and visible light with a wavelength of at most 450 nm from the surface on the glass plate B side of the laminate precursor E, the photocurable resin composition D for forming a resin layer was cured to form a resin layer thereby to obtain a display unit F. The display unit F did not require a step of removing air bubbles required during the production by a conventional injection method, and nevertheless, a defect such as air bubbles remaining in the resin layer was not observed. Further, a defect such as leakage of the photocurable resin composition for forming a resin layer from the seal part, was also not observed. Further, the resin layer had a desired thickness (about 0.4 mm) and width (about 1 mm).

Using a glass plate having substantially the same size instead of the display device A, a transparent laminate was prepared in the same manner, and the haze value at a portion free from the print-shielding portion was measured and found to be at most 1%, and thus the transparency was high and good.

The display unit F was returned to the casing for a liquid crystal TV receiver, from which the liquid crystal display device was taken out, and the wiring was connected again, and the display unit was switched on, whereby an image having a higher display contrast than at the initial stage was obtained. Even when the image display surface was pressed strongly with a finger, the image was not disturbed, and the glass plate B effectively protected the display device A.

Example 2

(Photocurable Resin Composition for Forming Seal Part)

A bifunctional polypropylene glycol having its molecular terminals modified with ethylene oxide (number average molecular weight calculated from the hydroxy value: 4,000) and hexamethylene diisocyanate were mixed in a molar ratio of 6:7 and then diluted with n-dodecyl methacrylate, followed by a reaction at 70° C. in the presence of a catalyst of a tin compound to obtain a prepolymer, to which 2-hydroxyethyl acrylate was added in a molar ratio of substantially 1:2, followed by a reaction at 70° C. to obtain an urethane acrylate oligomer (hereinafter referred to as UC-3) solution diluted with 10 mass % of n-dodecyl methacrylate. The number of curable groups in UC-3 was 2, and the number average molecular weight was about 45,000. The viscosity at 60° C. of the UC-3 solution was about 650 Pa·s.

96 parts by mass of the UC-3 solution and 4 parts by mass of n-dodecyl methacrylate were uniformly mixed to obtain a mixture (proportion of the monomer (B) having a molecular weight of from 125 to 600: 13.6 mass %). 100 parts by mass of such a mixture, 0.1 part by mass of bis(2,4,6-trimethylbenzoyl)-phenylphosphine oxide (photopolymerization initiator, IRGACURE 819, manufactured by Ciba Specialty Chemicals), 0.04 part by mass of 2,5-di-t-butylhydroquinone (polymerization inhibitor) and 0.3 part by mass of an ultraviolet absorber (TINUVIN 109, manufactured by Ciba Specialty Chemicals) were uniformly mixed to obtain a photocurable resin composition G for forming a seal part.

The photocurable resin composition G for forming a seal part was, as put in a container, set in a reduced-pressure apparatus in an open state, and the inside of the reduced-pressure apparatus was depressurized to about 20 Pa and held for 10 minutes to carry out defoaming treatment. The viscosity at 25° C. of the photocurable resin composition G for forming a seal part, was measured and found to be about 1,300 Pa·s.

Then, the photocurable resin composition G for forming a seal part was interposed between a pair of soda lime glass (100×100 mm, thickness: 2 mm), so that the thickness would be about 1 mm, and ultraviolet rays having a wavelength of 365 nm with a light intensity of 2 mW/cm$^2$ were applied from a chemical lamp to obtain a cured product. The gel percentage of the cured product was obtained and found to be 66%, and the curability was not sufficient.

Example 3

(Photocurable Resin Composition for Forming Seal Part)

80 parts by mass of UA-2 used in Example 1, 10 parts by mass of 2-hydroxybutyl methacrylate (light ester HOB, manufactured by Kyoeisha Chemical Co., Ltd.) and 10 parts by mass of n-dodecyl methacrylate were uniformly mixed, and to 100 parts by mass of such a mixture, 0.2 part by mass of bis(2,4,6-trimethylbenzoyl)-phenylphosphine oxide (photopolymerization initiator, IRGACURE 819, manufactured by Ciba Specialty Chemicals), 0.04 part by mass of 2,5-di-t-butylhydroquinone (polymerization inhibitor), and 0.3 part by mass of an ultraviolet absorber (TINUVIN 109, manufactured by Ciba Specialty Chemicals) were uniformly dissolved to obtain a photocurable resin composition H for forming a seal part.

The photocurable resin composition H for forming a seal part was, as put in a container, set in a reduced-pressure apparatus in an open state, and the inside of the reduced-pressure apparatus was depressurized to about 20 Pa and held for 10 minutes to carry out defoaming treatment. The viscosity at 25° C. of the photocurable resin composition H for forming a seal part was measured and found to be 400 Pa·s, which was lower than the preferred viscosity.

(Step (a))

Along the entire periphery at a position of about 5 mm outside an image display region of the display device A, the photocurable resin composition H for forming a seal part was applied by a dispenser so that the width became about 1 mm, and the applied thickness became about 0.6 mm, to form an uncured seal part.

However, only two minutes later, the photocurable resin composition H for forming a seal part started to spread in the width direction of the seal part, whereby it was not possible to maintain the shape of the uncured seal part.

Further, by another photocurable resin composition for forming a seal part (viscosity at 25° C.: 3,200 Pa·s), it is not possible to apply a seal part uniformly.

Industrial Applicability

The curable resin composition for forming a seal part of the present invention is useful as a material to form the seal part at the time of producing a laminate (laminated glass, a display unit, a solar cell module, etc.) by curing a curable resin composition for forming a resin layer interposed between the first and second plates in such a state that the periphery is enclosed by the seal part.

Reference Symbols

1: Transparent laminate
2: Display unit
3: Solar cell module
4: Solar cell module
5: Solar cell module
10: Transparent plate
12: Uncured seal part
13: Region
14: Photocurable resin composition for forming resin layer
16: Glass substrate
17: Thin-film type solar cell device
40: Resin layer
42: Seal part
50: Display device

What is claimed is:

1. A process for producing a laminate comprising first and second plates, a resin layer interposed between the first and second plates, and a seal part enclosing the periphery of the resin layer, which process comprises:
   (a) applying a curable resin composition for forming a seal part having a viscosity of from 500 to 3,000 Pa·s at 25° C., along the edge of the surface of a first plate, to form an uncured seal part,
   (b) supplying a liquid curable resin composition for forming a resin layer to a region enclosed by the uncured seal part,
   (c) laminating a second plate on the curable resin composition for forming a resin layer in a reduced-pressure atmosphere of not more than 100 Pa, to obtain a laminate having the curable resin composition for forming a resin layer hermetically sealed by the first and second plates and the uncured seal part, and
   (d) curing the uncured seal part and the curable resin composition for forming a resin layer in such a state that the laminate is placed in a pressure atmosphere of at least 50 kPa.

2. The process for producing a laminate according to claim 1, wherein the thickness of the curable resin composition for forming a resin layer in the laminate obtained in the step (c) is from 10 μm to 3 mm.

3. The process for producing a laminate according to claim 1, wherein the curable resin composition for forming the seal part comprises at least one oligomer (A) having a curable group and a number average molecular weight of from 30,000 to 100,000, and at least one monomer (B) having a curable group and a molecular weight of from 125 to 600, wherein the proportion of the monomer (B) is from 15 to 50 mass %, based on the total (100 mass %) of the oligomer (A) and the monomer (B).

4. The process for producing a laminate according to claim 3, wherein the curable group is at least one type of group selected from the group consisting of an acryloyloxy group and a methacryloyloxy group.

5. The process for producing a laminate according to claim 3, wherein the curable group of the oligomer (A) is an acryloyloxy group, and the curable group of the monomer (B) is a methacryloyloxy group.

6. The process for producing a laminate according to claim 3, wherein the oligomer (A) is an urethane oligomer (A1).

7. The process for producing a laminate according to claim 6, wherein the curable resin composition for forming the seal part contains, as the monomer (B), a monomer (B1) not having a group reactive with an isocyanate group, wherein the urethane oligomer (A1) is one obtained by reacting a polyol with a polyisocyanate in the presence of the monomer (B1) to obtain a prepolymer having an isocyanate group, and then, reacting a monomer (B2) having a curable group and a group reactive with an isocyanate group, to the isocyanate group of the prepolymer.

8. The process for producing a laminate according to claim 3, wherein the curable resin composition for forming the seal part contains, as the monomer (B), a monomer (B3) having a hydroxy group.

9. The process for producing a laminate according to claim 3, wherein the curable resin composition for forming the seal part is a photo-curable resin composition containing a photopolymerization initiator (C).

10. The process for producing a laminate according to claim 9, wherein the curable resin composition for forming the seal part contains, as the photopolymerization initiator (C), at least two types of photopolymerization initiators different in the absorption wavelength region.

* * * * *